US012622064B2

(12) United States Patent
Huang et al.

(10) Patent No.: US 12,622,064 B2
(45) Date of Patent: May 5, 2026

(54) INTEGRATED STANDARD CELL STRUCTURE

(71) Applicant: TAIWAN SEMICONDUCTOR MANUFACTURING COMPANY, LTD., Hsinchu (TW)

(72) Inventors: Shih-Hsien Huang, Yilan County (TW); Cheng-Hua Liu, Hsinchu County (TW); Kuang-Hung Chang, Hsinchu (TW); Sheng-Hsiung Wang, Hsinchu County (TW); Chun-Yen Lin, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 719 days.

(21) Appl. No.: 17/837,925

(22) Filed: Jun. 10, 2022

(65) Prior Publication Data

US 2023/0402444 A1 Dec. 14, 2023

(51) Int. Cl.
*H10D 89/10* (2025.01)
*H10D 84/83* (2025.01)

(52) U.S. Cl.
CPC ........... *H10D 89/10* (2025.01); *H10D 84/834* (2025.01)

(58) Field of Classification Search
CPC ..... H10D 89/10; H10D 84/834; H10D 84/853
See application file for complete search history.

(56) References Cited

U.S. PATENT DOCUMENTS

| | | | |
|---|---|---|---|
| 10,276,554 B1 | 4/2019 | Chen et al. | |
| 10,497,693 B1 | 12/2019 | Huang et al. | |
| 2019/0386000 A1* | 12/2019 | Chen .................... | H10D 84/038 |
| 2020/0105752 A1* | 4/2020 | Liaw .................. | H10D 30/6757 |

FOREIGN PATENT DOCUMENTS

TW          202129773 A          8/2021

* cited by examiner

*Primary Examiner* — Brian Turner
*Assistant Examiner* — Zhijun Xu
(74) *Attorney, Agent, or Firm* — HAYNES AND BOONE, LLP

(57) ABSTRACT

An integrated circuit (IC) structure includes a fin structure protruding from a semiconductor substrate, the fin structure including a first portion having a first width, a second portion having a second width that is different from the first width, and a third portion extending continuously along a first direction over the semiconductor substrate, the first width and the second width being measured along a second direction perpendicular to the first direction. The IC structure also includes a first standard cell including a first metal gate stack engaged with the first portion, a second standard cell including a second metal gate stack engaged with the second portion, and a filler cell disposed between the first standard cell and the second standard cell, where the filler cell includes the third portion that connects the first portion to the second portion. The IC further includes a dielectric gate defining a first boundary of the filler cell and a third metal gate stack defining a second boundary of the filler cell, where the dielectric gate and the third metal gate stack are separated by a one-pitch spacing.

20 Claims, 51 Drawing Sheets

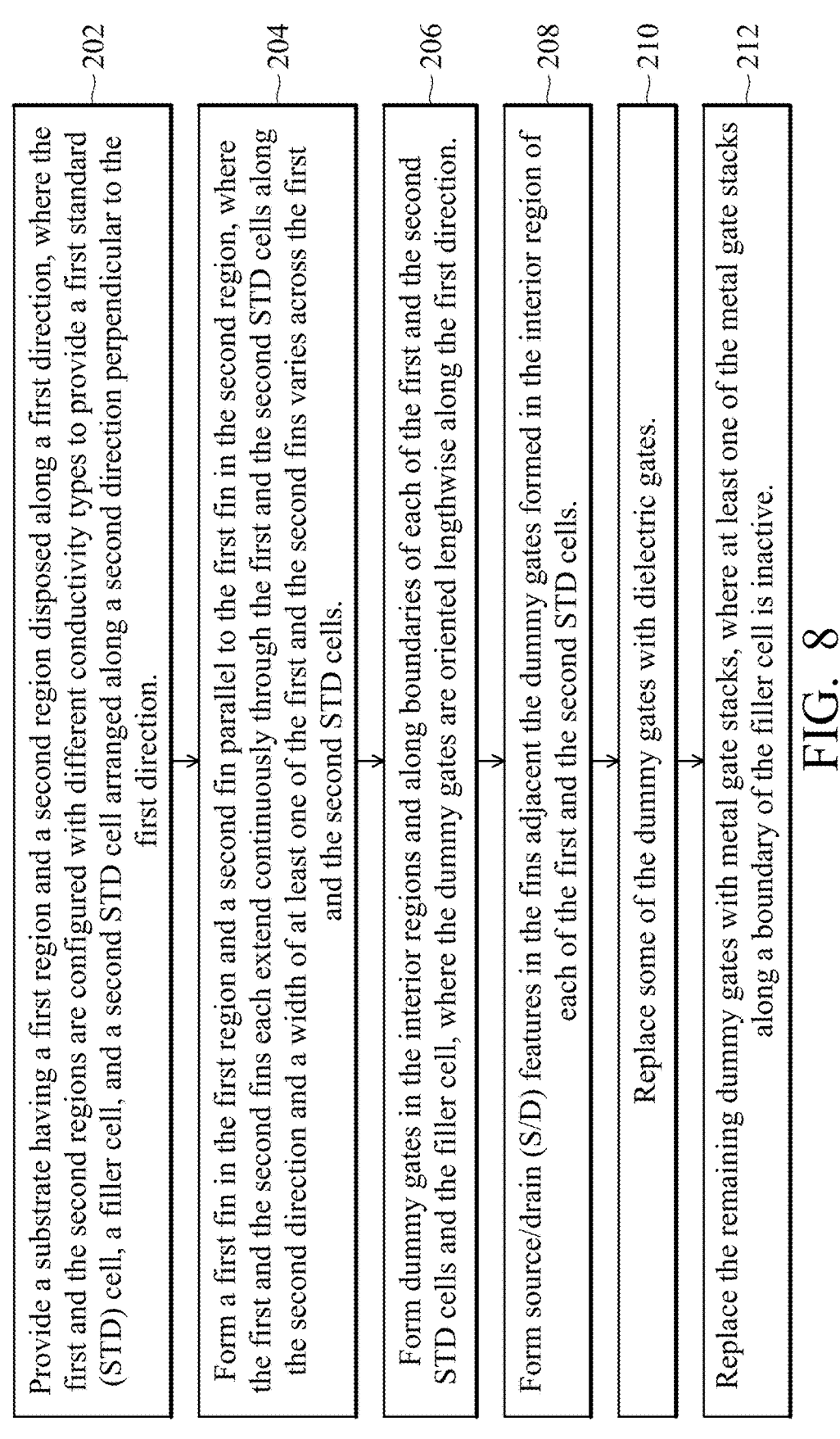

200

202 — Provide a substrate having a first region and a second region disposed along a first direction, where the first and the second regions are configured with different conductivity types to provide a first standard (STD) cell, a filler cell, and a second STD cell arranged along a second direction perpendicular to the first direction.

204 — Form a first fin in the first region and a second fin parallel to the first fin in the second region, where the first and the second fins each extend continuously through the first and the second STD cells along the second direction and a width of at least one of the first and the second fins varies across the first and the second STD cells.

206 — Form dummy gates in the interior regions and along boundaries of each of the first and the second STD cells and the filler cell, where the dummy gates are oriented lengthwise along the first direction.

208 — Form source/drain (S/D) features in the fins adjacent the dummy gates formed in the interior region of each of the first and the second STD cells.

210 — Replace some of the dummy gates with dielectric gates.

212 — Replace the remaining dummy gates with metal gate stacks, where at least one of the metal gate stacks along a boundary of the filler cell is inactive.

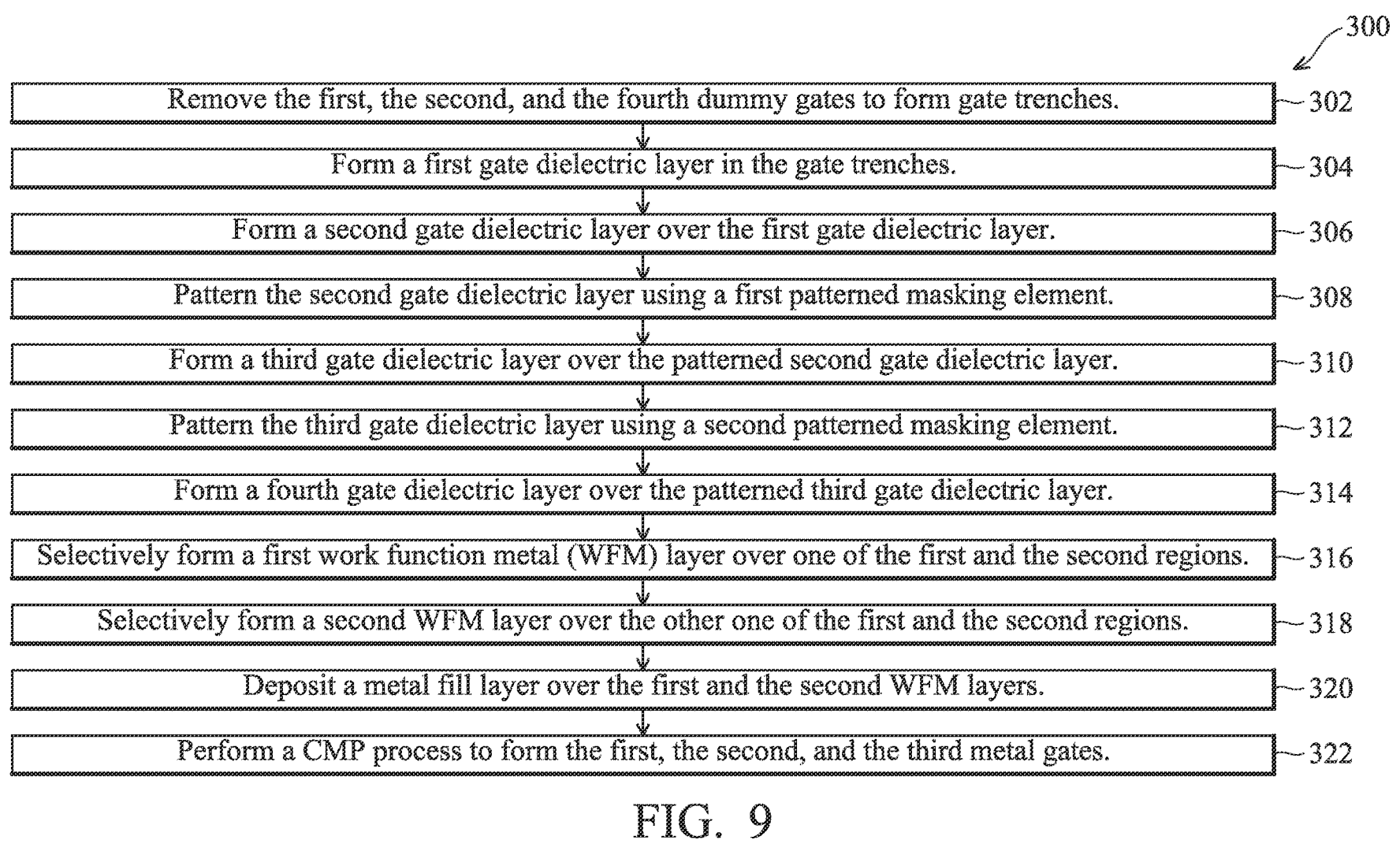

302  Remove the first, the second, and the fourth dummy gates to form gate trenches.

304  Form a first gate dielectric layer in the gate trenches.

306  Form a second gate dielectric layer over the first gate dielectric layer.

308  Pattern the second gate dielectric layer using a first patterned masking element.

310  Form a third gate dielectric layer over the patterned second gate dielectric layer.

312  Pattern the third gate dielectric layer using a second patterned masking element.

314  Form a fourth gate dielectric layer over the patterned third gate dielectric layer.

316  Selectively form a first work function metal (WFM) layer over one of the first and the second regions.

318  Selectively form a second WFM layer over the other one of the first and the second regions.

320  Deposit a metal fill layer over the first and the second WFM layers.

322  Perform a CMP process to form the first, the second, and the third metal gates.

FIG. 9

INTEGRATED STANDARD CELL STRUCTURE

BACKGROUND

In the design of integrated circuits (IC), standard (STD) cells with certain functions are repeated used with high frequency. Accordingly, those standard cells are predesigned and packed in a cell library. The cell library is provided to the IC designers for their particular designing. During integrated circuit designing, the standard cells are retrieved from the cell libraries and placed into desired locations, thus reducing the design effort. Routing is then performed to connect the standard cells and other circuit blocks to form the desired integrated circuit. Pre-defined design rules are followed when placing the standard cells into the desired locations.

During IC manufacturing, it may be desirable to integrate STD cells of various sizes and/or structures to provide design flexibility and to achieve specific target performance at reduced length scales. One such example may be the variation in fin widths across different STD cells. While methods of forming such layout are generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8 is a flowchart of an example method of fabricating a semiconductor structure, according to various aspects of the present disclosure.

FIG. 9 is a flowchart of an example method of fabricating a semiconductor structure, according to various aspects of the present disclosure.

DETAILED DESCRIPTION

Figure 1:
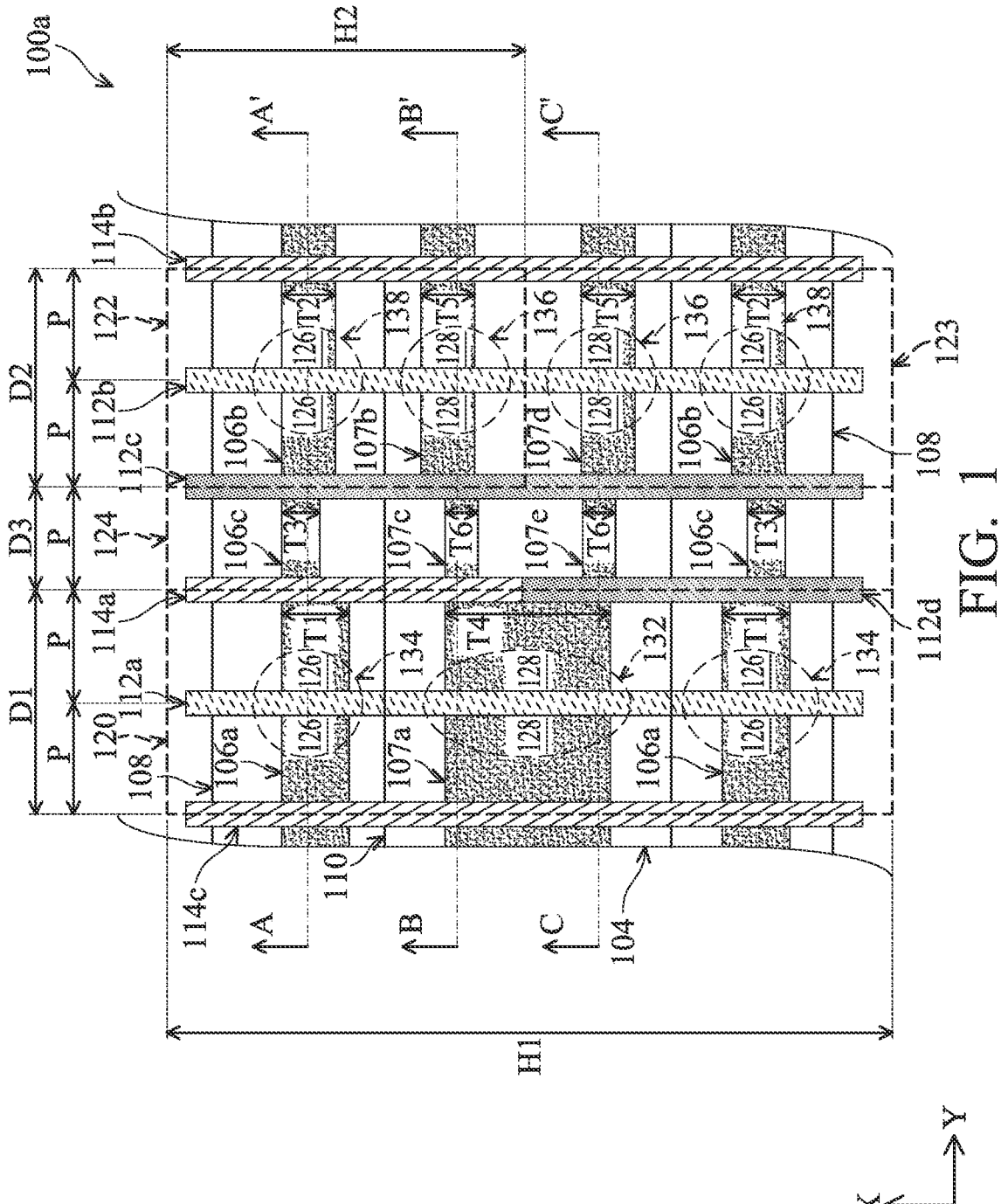
FIGS. 1, 3, 5, and 7 are top views of an example semiconductor structure, or a portion thereof, according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about nm" encompasses the dimension range from 4.5 nm to 5.5 nm.

Figure 2A:
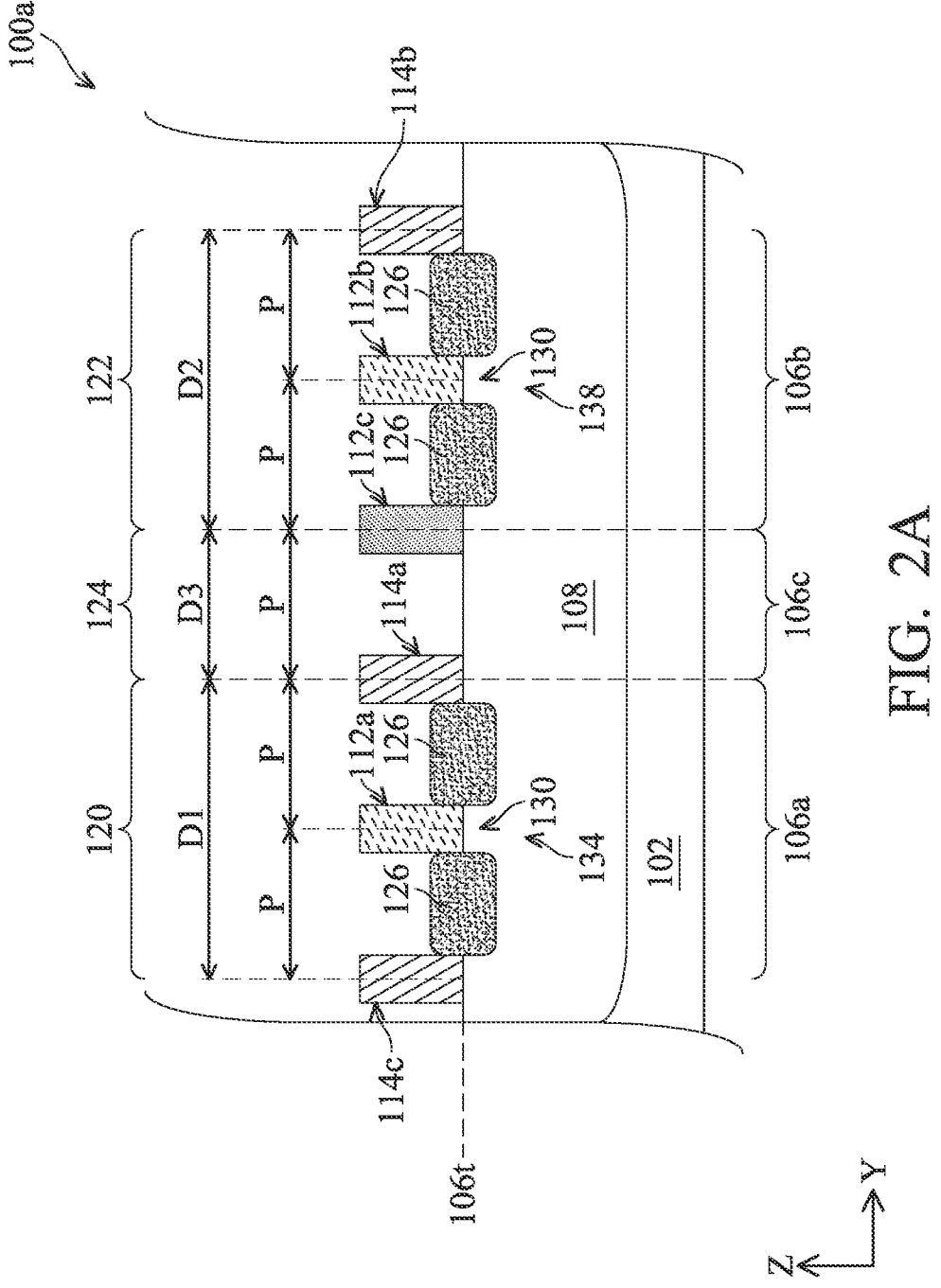
FIGS. 2A, 4A, and 6A are cross-sectional views of the example semiconductor structure taken along line AA' of FIGS. 1, 3, and 5, respectively, according to various aspects of the present disclosure.
Figure 2B:
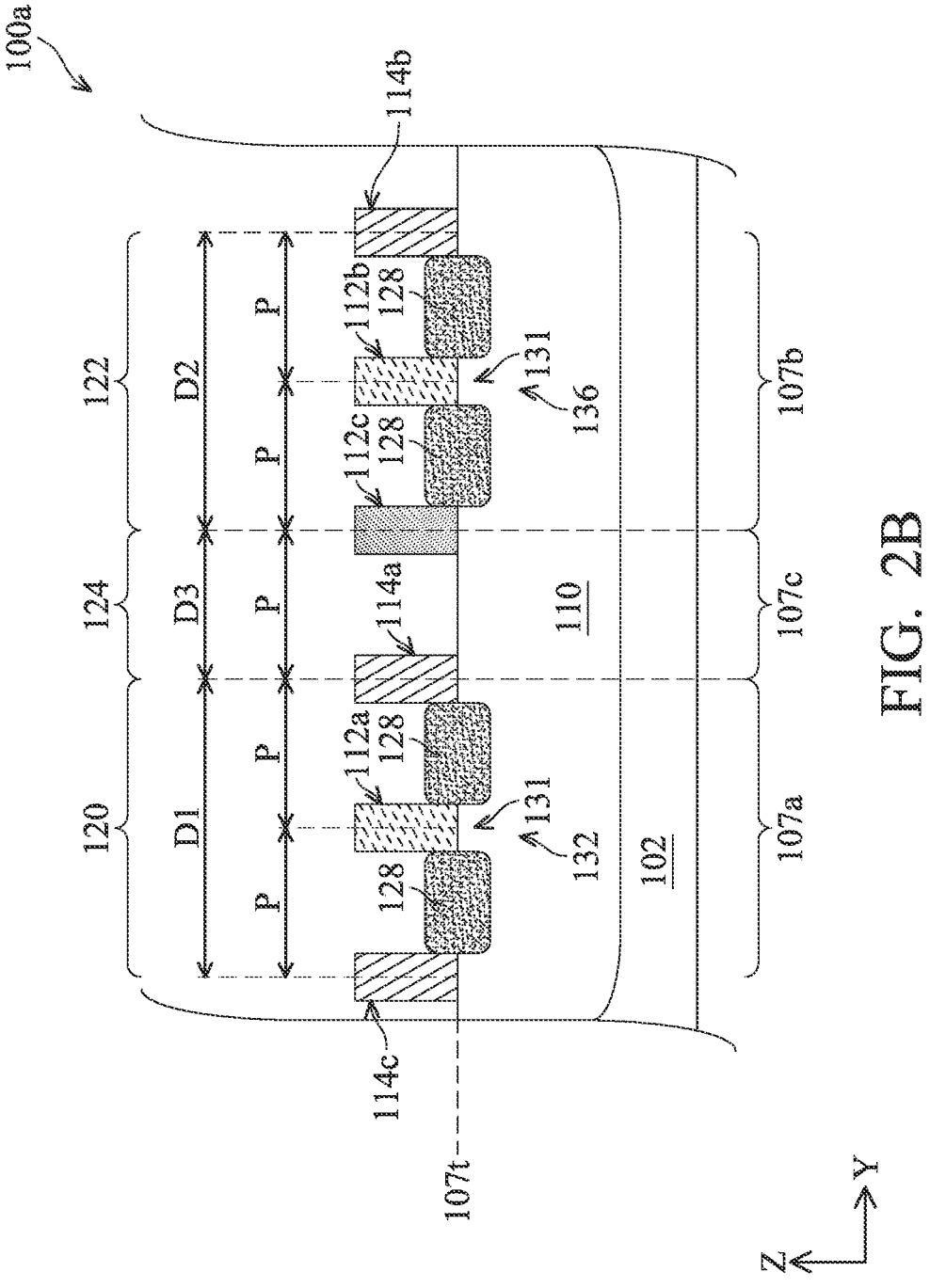
FIGS. 2B, 4B, and 6B are cross-sectional views of the example semiconductor structure taken along line BB' of FIGS. 1, 3, and 5, respectively, according to various aspects of the present disclosure.
Figure 2C:
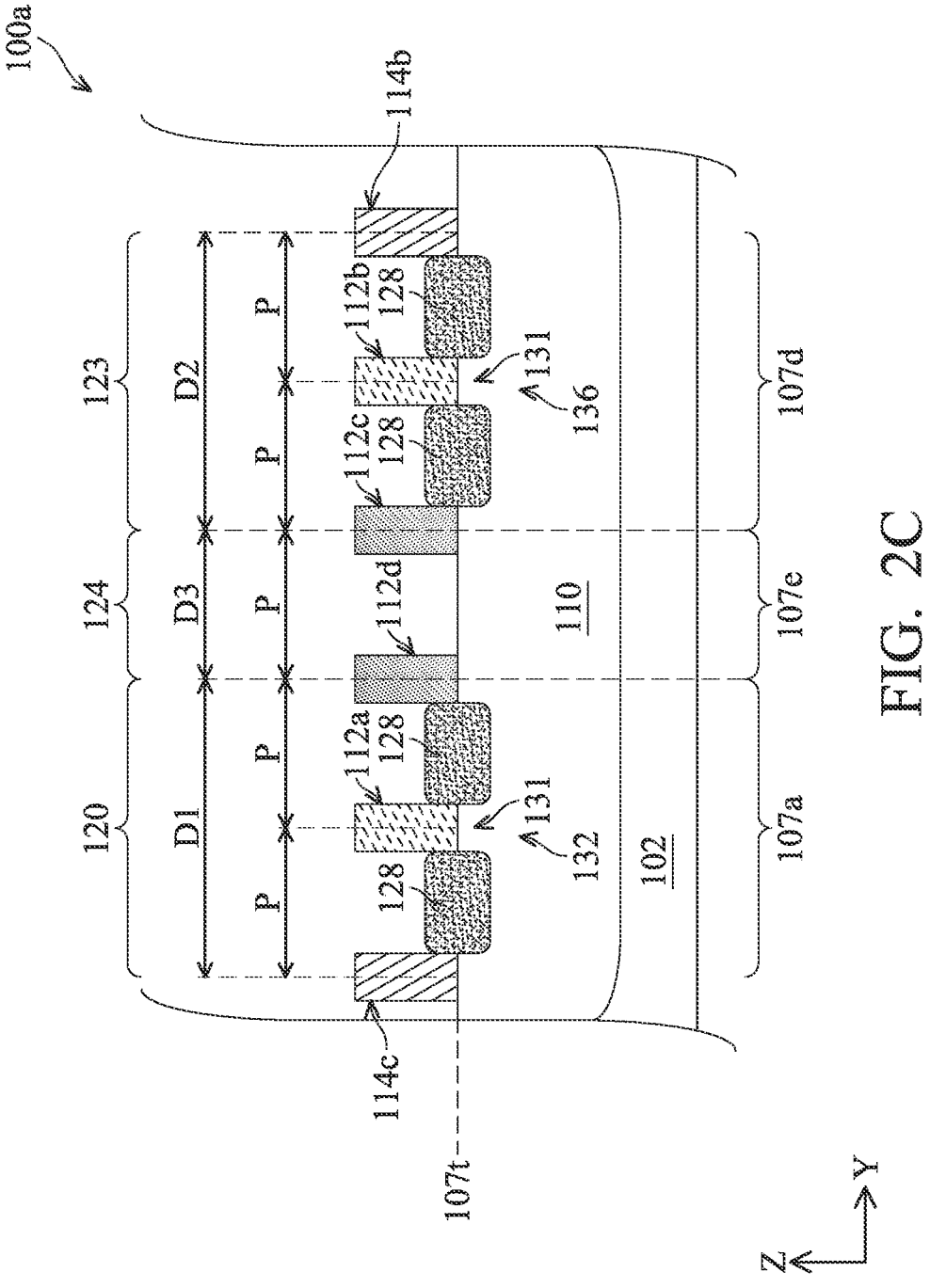
FIGS. 2C, 4C, and 6C are cross-sectional views of the example semiconductor structure taken along line CC' of FIGS. 1, 3, and 5, respectively, according to various aspects of the present disclosure.

The present disclosure provides a semiconductor structure 100a including an integrated circuit (IC) layout or a portion thereof. The semiconductor structure 100a is discussed in reference to FIGS. 1 and 2A-2C, where FIG. 1 is a top view of the semiconductor structure 100a, and FIGS. 2A-2C are cross-sectional view of the semiconductor structure 100a taken along lines AA', BB', and CC, respectively, constructed according to various aspects of the present disclosure. In some embodiments, the semiconductor structure 100*a* includes flat active regions configured to form planar field-effect transistors (FETs). In some embodiments, the semiconductor structure 100*a* includes fin active regions configured to form fin-like FETs (FinFETs). In some embodiments, the semiconductor structure 100*a* includes stacks of semiconductor layers or semiconductor wires interleaved with a gate structure, which are configured to form multi-gate FETs, such as gate-all-around (GAA) or nanosheets (NS) or nanowire (NW) FETs. For purposes of illustration, the present embodiments are discussed in the context of FinFETs and methods of forming the same.

The semiconductor structure 100*a* may be an intermediate device fabricated during processing of an IC, or a portion thereof, that may comprise static random-access memory (SRAM) and/or logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. For purposes of illustration, the present embodiments are discussed in the context of FinFETs and methods of forming the same. However, the present embodiments are not limited to any particular number of devices or device regions, or to any particular device configurations. Additional features can be added to the semiconductor structure 100*a*, and some of the features described below can be replaced, modified, or eliminated in other embodiments of the semiconductor structure 100*a*.

In various embodiments, the semiconductor structure 100*a* includes one or more standard (STD) cell placed to the IC layout by predefined rules. Standard cells may be repeatedly used in various IC layouts and therefore predesigned according to manufacturing technologies and stored in a standard cell library. IC designers could retrieve one or more types of standard cells, incorporate them in an IC design, and place them into an IC layout according to the predefined placing rules. The standard cells may include various basic circuit devices, such as inverter, AND, NAND, OR, XOR, and NOR, which are commonly used in digital circuit design for applications including central processing unit (CPU), graphic processing unit (GPU), and system on chip (SOC) chip designs. The Standard cells may include other frequently used circuit blocks, such as flip-flop circuit and latch.

Referring to FIGS. 1 and 2A-2C, the semiconductor structure 100*a* includes a substrate 102. The substrate 102 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing.

The substrate 102 includes various doped features, such as n-type doped wells, p-type doped wells, source and drain features, and/or other doped features configured to form various devices or components of such devices. In the present example illustrated in FIG. 1, the semiconductor structure 100*a* includes a p-type doped well (hereafter referred to as a P well) 108 and a n-type doped well (hereafter referred to as an N well) 110. The P well 108 includes a p-type dopant, such as boron, indium, gallium, and/or other p-type dopants, and the N well 110 includes an n-type dopant, such as arsenic, phosphorus, and/or other n-type dopants. The P well 108 and the N well 110 are formed by suitable technologies, such as ion implantation, diffusion, or a combination thereof. In the depicted embodiments, cross-sections taken along line AA' (FIG. 2A) is through the P well 108 and cross-sections taken along line BB' (FIG. 2B) and line CC' (FIG. 2C) are through the N well 110.

In the present embodiments, the substrate 102 also includes various isolation features, such as isolation features 104 formed on the substrate 102 to separate active region 106, which includes portions 106*a*, 106*b*, and 106*c* and active region 107, which includes portions 107*a*, 107*b*, 107*c*, 107*d*, and 107*e*. The isolation features 104 may include silicon oxide (SiO and/or SiO$_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 104 may include shallow trench isolation (STI) features. In some embodiments, the isolation features 104 are formed by filling trenches that separate the active regions 106 and 107 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 104. The isolation features 104 may include a single-layer structure or a multi-layer structure.

The active regions 106 and 107 are regions of the semiconductor structure 100*a* over which various doped features are formed and configured to provide one or more devices, such as a diode, a transistor, and/or other suitable devices. The active regions 106 and 107 may include a semiconductor material similar to that of the bulk semiconductor material of the substrate 102, such as silicon, or may include a different semiconductor material, such as silicon germanium (SiGe) and/or silicon carbide (SiC), or multiple semiconductor material layers, such as a stack of alternating silicon and silicon germanium layers, formed on the substrate 102 by one or more epitaxial growth process. In some embodiments, the active regions 106 and 107 are configured to provide enhancement in device performance, such as introducing strain effect to increase carrier mobility. In the present embodiment, the active regions 106 are formed in the P well 108 to provide n-type devices, such as NFETs 134, and the active regions 107 are formed in the N well 110 to provide p-type devices, such as PFETs 132. In the present embodiments, the P well 108 and N well 110 each extend lengthwise along the Y axis and are spaced from each other along the X axis.

In the present embodiments, the fin structures 106 and 107 (hereafter referred to as fin structures 106 and 107) are three-dimensional structures extending above the isolation features 104. The three-dimensional structure of the fin structures 106 and 107 provide more effective coupling between the channel and the gate electrode of an FET. Particularly, referring to FIGS. 2A-2C, the fin structures 106 and 107 each have a top surface 106*t* and 107*t*, respectively, which are above a top surface of the substrate 102. In the present embodiments, the fin structures 106 and 107 are oriented lengthwise along the Y axis and spaced from each other along the X axis. Specifically, the portions 106a-106c extend continuously in this order along the Y axis, the portions 107a-107c extend continuously along the Y axis, and the portions 107a, 107d, and 107e extend continuously along the Y axis. In the present embodiment, X and Y axes are orthogonal and define the top surface of the substrate 102.

In IC manufacturing it is oftentimes desirable to integrate STD cells of various sizes and/or structures to provide design flexibility and to achieve specific target performance at reduced length scales. One such example may be the variation in fin widths across different STD cells. In the present embodiments, fins across two adjacent STD cells are configured with different widths to form FETs with different properties. For example, wider fins may increase current output for high-speed applications and narrower fins may reduce power consumption. In some instances, especially as feature sizes shrink, additional layout features may be introduced during manufacturing process to accommodate variations between fin widths across different STD cells.

In the present embodiments, referring to FIG. 1, the portions 106a-106c vary in width along the Y axis. For example, the portion 106a is defined by a width T1, the portion 106b is defined by a width T2, and the portion 106c is defined by a width T3, where the width T1 is greater than the width T2 and the width T3, and where the width T2 is different form the width T3. In some embodiments, the width T3 is less than the width T2, resulting in sidewalls of the portions 106b and 106c to form an L-shaped step profile. Similarly, the portions 107a-107c vary in width along the Y axis, where a width T4 of the portion 107a is greater than a width T5 of the portion 107b and a width T6 of the portion 107c, with the width T6 being different from the width T5. In some embodiments, the width T4 is greater than the width T1. In some embodiments, the width T6 is less than the width T5, such that sidewalls of the portions 107b (or 107d) and 107c (or 107e) form an L-shaped step profile. The widths T3 and T6 may be the same or different according to various embodiments. In some embodiments, the difference between the widths T1 and T2 and the difference between the widths T4 and T5 is each less than about 20 nm. In some embodiments, to achieve layout symmetry and balance device performance, the portions 107b and 107d are formed to the same width T5 and the portions 107c and 107e are formed to the same width T6. Due to the difference in fin widths, the portion 106c connects the portions 106a and 106b over a transitional region (e.g., filler cell 124) between two STD cells (e.g., STD cells 120 and 122). Similarly, the portion 107c and 107e joins the portions 107a with 107b and 107a with 107d, respectively, in the same transitional region. In this regard, the portions 106c and 107c (and 107e) may be alternatively referred to as bridge structures or jog structures between the fins disposed within the two STD cells 120 and 122.

The fin structures 106 and 107 may be formed by selective etching recesses in the isolation features 104 and epitaxially growing the fin structures 106 and 107 in the recesses. Alternatively, the fin structures 106 and 107 may be formed by performing selective epitaxial growth to form a semiconductor layer and subsequently patterning the semiconductor layer using one or more photolithography masks to form the fin structures 106 and 107. In this regard, the photolithography masks may be patterned with the various fin widths as discussed above and used to directly pattern the semiconductor layer to form the fin structures 106 and 107. Subsequently, the isolation features 104 may be formed by depositing a dielectric layer over the fin structures 106 and

107, planarizing the dielectric layer to expose the fin structures 106 and 107, and etching back the dielectric layer.

In some examples, the fin structures 106 and 107 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, may then be used to pattern the fin structures 106 and 107.

Still referring to FIGS. 1 and 2A-2C, the semiconductor structure 100a further includes various metal gate stacks (alternatively referred to as metal gate structures) 112a, 112b, and 112c (collectively referred to as metal gate stacks 112 for the sake of brevity) extending lengthwise along the X axis, i.e., perpendicular to the lengthwise direction of the fin structures 106 and 107, and separated from each other along the Y axis. In the present embodiments, the metal gate stacks 112a and 112b are functional metal gate stacks engaging with source/drain (S/D) features of the fin structures 106 and 107 to form various devices (e.g., FETs) over the substrate 102, while the metal gate stack 112c is a dummy metal gate stack that does not form any device over the substrate 102. In the depicted embodiments, the dummy metal gate stack 112c is configured with the same structure as and formed by the same process as the nearest functional metal gate stack, which is metal gate stack 112b. In this case, the dummy metal gate stack 112c is separated from the nearest metal gate stack 112b by a distance of 1*P.

In the present embodiments, the metal gate stacks 112 each include at least a gate dielectric layer, a work function metal (WFM) layer over the gate dielectric layer, and a metal fill layer over the WFM layer. In some embodiments, each metal gate stack 112 further includes an interfacial layer, a capping layer, a barrier layer, and/or other suitable layers. The metal gate stacks 112 may be formed by a gate replacement process. For example, dummy or placeholder gate structures (e.g., dummy gate structures 113 to be discussed in detail below) may be first formed over the fin structures 106 and 107 by a series of deposition and patterning processes, and after forming other components of the semiconductor structure 100a (e.g., source/drain features), the dummy gate structures are removed to form gate trenches, various material layers of the metal gate stacks 112 are deposited (and patterned, in some instances) in the gate trenches, and one or more planarization processes (e.g., chemical-mechanical planarization, or CMP, process) are implemented to form the metal gate stacks 112.

The semiconductor structure 100a further includes a plurality of dielectric gates 114a, 114b, and 114c (collectively referred to as dielectric gates 114 for the sake of brevity) disposed over the substrate 102. In the present embodiments, the dielectric gates 114 are oriented lengthwise along the X axis and spaced from an adjacent metal gate stack 112 (or another dielectric gate 114) along the Y axis at a constant spacing P, which is also referred to as a gate pitch P hereafter.

In the present embodiments, the dielectric gates 114 are not conductive and thus do not provide any functional devices as the functional metal gate stacks 112 do. Instead, the dielectric gates 114 each include one or more dielectric material and function as an isolation feature, in some instances, between adjacent STD cells. In this regard, the dielectric gates 114 may alternatively be referred to as dummy dielectric gates. In some embodiments, the dielectric gates 114 each include a single-layered structure or a multi-layered structure having one or more dielectric material, such as silicon oxide, silicon nitride, silicon carbide, silicon oxynitride, a low-k dielectric material, and/or other suitable dielectric materials.

In some embodiments, the dielectric gates 114 are formed alongside the metal gate stacks 112 during the gate replacement process discussed above. For example, after removing all of the dummy gate structures to form the gate trenches, a subset of the gate trenches is filled with various material layers to form the metal gate stacks 112 while the remaining gate trenches are filled with one or more dielectric materials to form the dielectric gates 114. One or more CMP processes may be implemented after depositing the dielectric materials to form the dielectric gates 114.

In some embodiments, the dielectric gates 114 are formed before forming the metal gate stacks 112. For example, a subset of the dummy gate structures is first removed to form gate trenches among the remaining dummy gate structures, then the gate trenches are filled with one or more dielectric materials to form the dielectric gates 114. Subsequently, the remaining dummy gate structures are replaced with the metal gate stacks 112 in a gate replacement process similar to that discussed above.

In some embodiments, because the active regions (i.e., fin structures 106 and 107) are continuous across different STD cells, the dielectric gates 114 are positioned at one or more boundaries of the STD cells to provide isolation therebetween. In some embodiments (not depicted herein), some of the dielectric gates 114 are placed inside the STD cells (e.g., between the cell boundaries along the X axis) to provide isolation between adjacent FETs and/or to adjust pattern density for improved manufacturing processability, for example.

Referring to FIG. 1, the semiconductor structure 100a includes a STD cell 120 and a STD cell 122, where each STD cell is oriented lengthwise along the X axis and spaced from each other along the Y axis. The semiconductor structure 100a further includes a filler cell 124 sandwiched between the STD cell 120 and the STD cell 122, i.e., the filler cell 124 borders both the STD cell 120 and the STD cell 122. In the present embodiments, the STD cells 120 and 122 each include at least two functional devices (e.g., an NFET and a PFET) integrated together, while the filler cell 124 is free of any functional device.

In the present embodiments, the dielectric gates 114 are configured to define, at least partially, one or both boundaries of each STD cell along the X axis. For example, the dielectric gates 114a and 114c define both boundaries of the STD cell 120, while the dielectric gate 114b defines one of the boundaries of the STD cell 122 that is farther away from the STD cell 120 and the metal gate stack 112c defines the other one of the boundaries of the STD cell 122 that is closer to the STD cell 120. In this regard, because the portions 106b and 106c (as well as the portions 107b and 107c) are formed to different widths, the metal gate stack 112c does not form any functional device over the active regions. Accordingly, the metal gate stack 112c may alternatively referred to as a dummy metal gate stack 112c.

In some embodiments, the STD cell 120 and the STD cell 122 differ in cell structure and dimension. For example, in the depicted embodiments, the metal gate stack 112a engages with the portions 106a to form a first NFET 134 and a second NFET 134, respectively, and with the portion 107a to form a PFET 132, all arranged along the X axis within the STD cell 120, and the metal gate stack 112b engages with the portions 106b and 107b to form a NFET 138 and a PFET 136, respectively, in the STD cell 122. In other words, an interior region (i.e., between two boundaries along the X axis) of each of the STD cell 120 and the STD cell 122 includes one metal gate stack, i.e., the metal gate stack 112a and the metal gate stack 112b, respectively, while the filler cell is free of any metal gate stack 112 disposed in its interior region. Furthermore, the PFET 132 and the first and the second NFETs 134 in the first standard cell 120 are integrated to form a functional circuit block; and the PFET 136 and the NFET 138 in the second standard cell 122 are integrated to form a functional circuit block. Accordingly, the STD cell 120 includes one more FET than the STD cell 122.

In some examples, additional cells similar to the STD cell 120 and/or the STD cell 122 may be provided over the substrate 102. For example, a STD cell 123 as depicted in FIG. 1 may be formed over the substrate 102, where the STD cell 123 includes the PFET 136 integrated with the NFET 138, the STD cell 122 and the third STD cell 123 being arranged in a mirror symmetry about a boundary therebetween along the Y axis. In this regard, the PFETs 136 of the STD cell 122 and the STD cell 123 are both formed over the N well 110 and the metal gate stack 112b extends continuously through the STD cell 122 and the STD cell 123 along the X axis.

With respect to the cell height along the X axis, the STD cell 120 is configured with a height H1 that is greater than a height H2 of the STD cell 122. In some examples, the height H1 is configured may be two times the height H2 such that the two STD cells may be matched in dimension. With respect to the Y axis, the STD cell 120 has a width D1 that is defined by 2*P, the STD cell 122 has a width D2 that is defined by 2*P, and the filler cell 124 has a width D3 that is defined by P. In other words, the transitional region defined by the filler cell 124 spans a width that is about half of the width of the adjacent STD cells. It is noted the present disclosure does not limit the dimensions or arrangements of the STD cell 120, the STD cell 122, or the filler cell 124 to those provided herein.

In some embodiments, a dielectric gate 114 defining a boundary of a given STD cell is configured to extend along an entire height of that cell. For example, the dielectric gate 114b extends along an entirety of the height H2 of the STD cell 122 and the dielectric gate 114c extends along an entirety of the height H1 of the STD cell 120 as depicted in FIG. 1. In some embodiments, a dielectric gate 114 defining a boundary of a given STD cell is configured to extend partially along the height of that cell. For example, the dielectric gate 114a extends partially along the height H1 of the STD cell 120 as depicted in FIG. 1. In other words, the boundary of the STD cell 120 that borders the filler cell 124 may be defined by a hybrid gate comprising a dielectric gate (i.e., the dielectric gate 114a) and a metal gate stack (i.e., metal gate stack 112d). In the present embodiments, the metal gate stack 112d is a dummy metal gate stack similar to the metal gate stack 112c discussed in detail above. In some embodiments, the height of the dielectric gate between an STD cell (e.g., the STD cell 120) and a bordering filler cell 124 (e.g., the dielectric gate 114a) is consistent with the height of the adjacent STD cell (e.g., the STD cell 122). For example, the dielectric gate 114a is defined by the height H2, which is the height of the STD cell 122. While not depicted, some embodiments provide that the dielectric gate 114a extends along an entirety of the height H1 of the STD cell 120 as do the dielectric gates 114b and 114c. As will be discussed in detail below, the height of the dielectric gate located at a boundary between two STD cells may be determined by the dimension of their respective device regions for purposes of metal gate stack patterning.

Referring to FIG. 2A, the metal gate stacks 112a and 112b each traverse a channel region 130 of the portions 106a and 106b, respectively, interposed between n-type source/drain (S/D) features 126. The n-type S/D features 126 may include one or more epitaxial layers of silicon (epi Si) or silicon carbon (epi SiC), where the silicon or silicon carbon is doped with an n-type dopant such as arsenic, phosphorus, and/or other n-type dopant. In the present disclosure, source/drain features may refer to a source feature or a drain feature, individually or collectively dependent upon the context.

Referring to FIG. 2B, the metal gate stacks 112a and 112b each traverse a channel region 131 of the portions 107a and 107b, respectively, the channel region 131 interposing between p-type S/D features 128. Similarly, referring to FIG. 2C, the metal gate stacks 112a and 112b each traverse the channel region 131 of the portions 107a and 107d, respectively, interposed between the p-type S/D features 128. The p-type S/D features 128 may include one or more epitaxial layers of silicon germanium (epi SiGe), where the silicon germanium is doped with a p-type dopant such as boron, germanium, indium, and/or other p-type dopants.

The n-type S/D features 126 and the p-type S/D features 128 may be formed by any suitable techniques, such as etching processes followed by one or more epitaxial processes. In one example, one or more etching processes are performed to remove portions of their corresponding fins to form recesses (not shown) therein. A cleaning process may be performed to clean the recesses with a hydrofluoric acid (HF) solution and/or other suitable solutions. Subsequently, one or more epitaxial growth processes are performed to grow epitaxial features in the recesses. The suitable dopant (s) may be applied in-situ during the epitaxial growth processes or introduced via implantation after forming the epitaxial layers.

Figure 3:
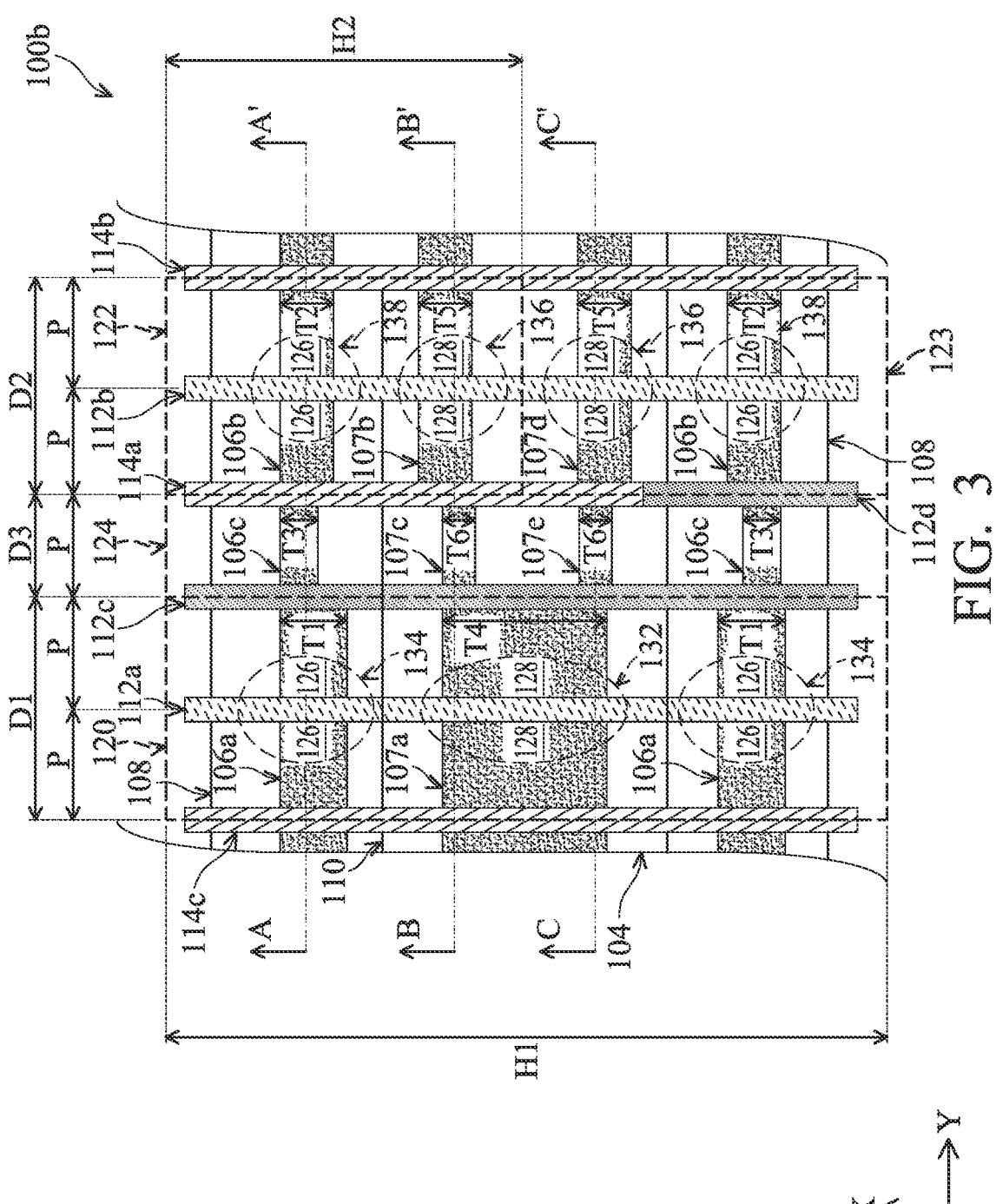
Figure 4A:
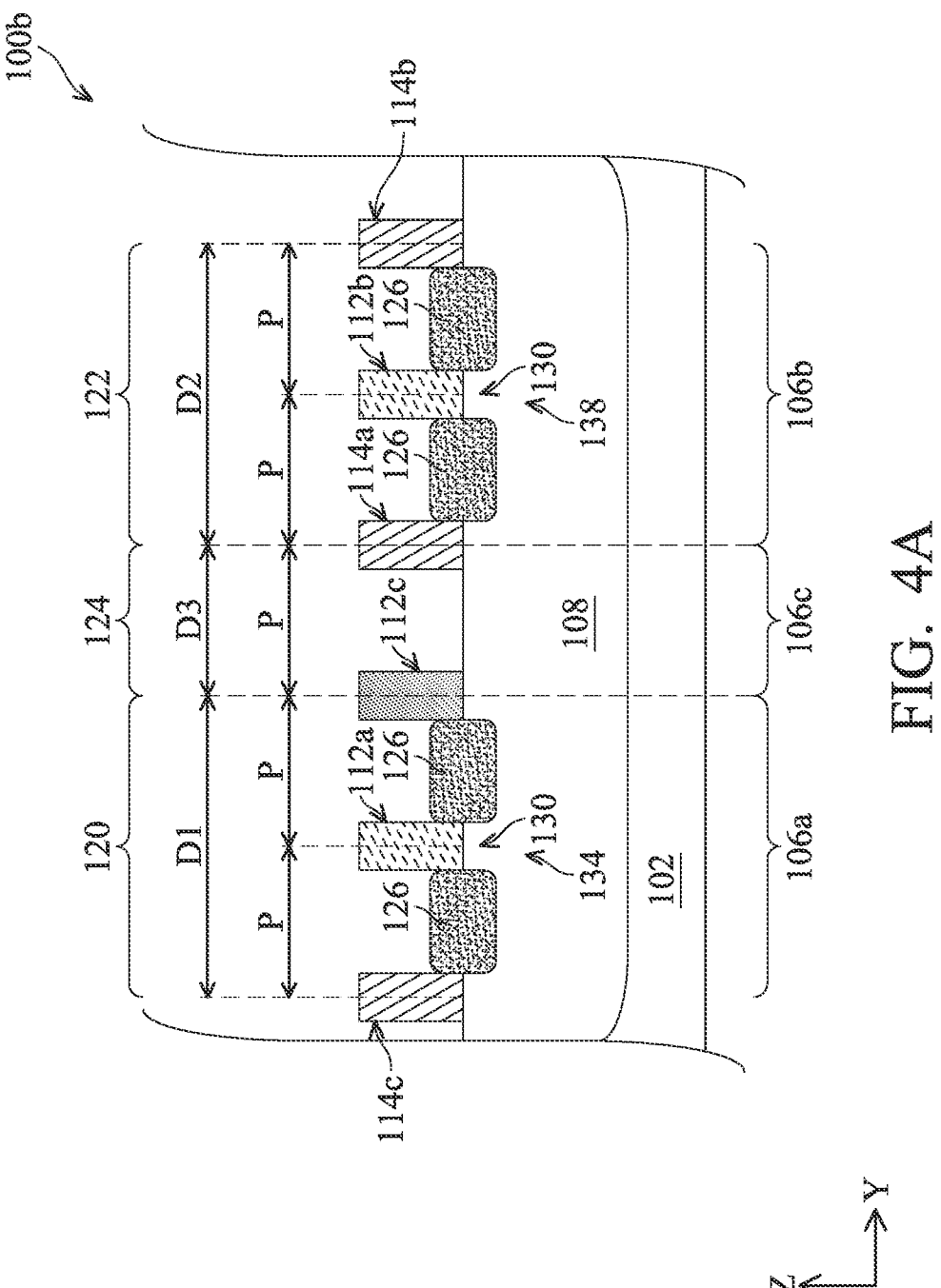
Figure 4B:
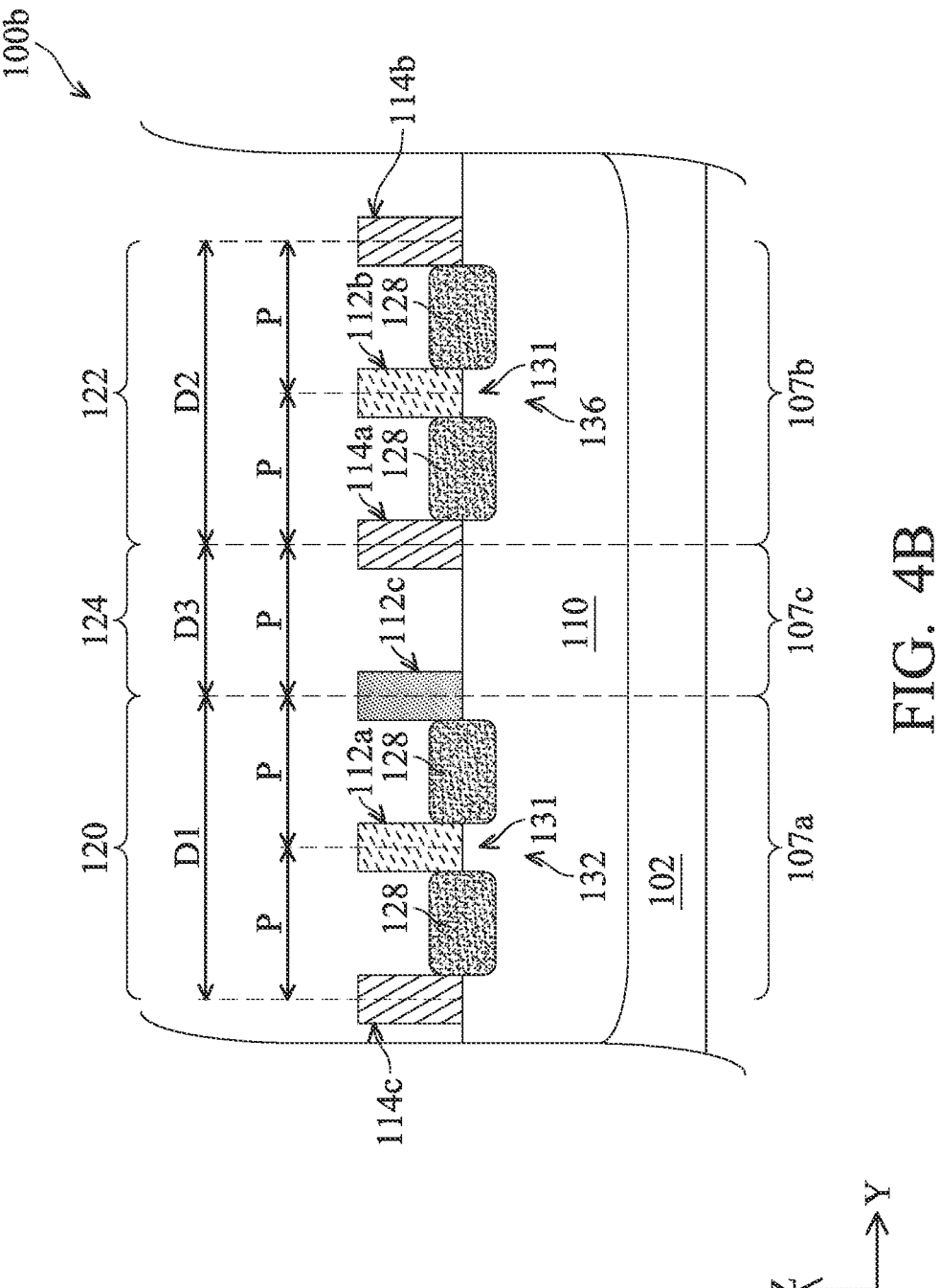
Figure 4C:
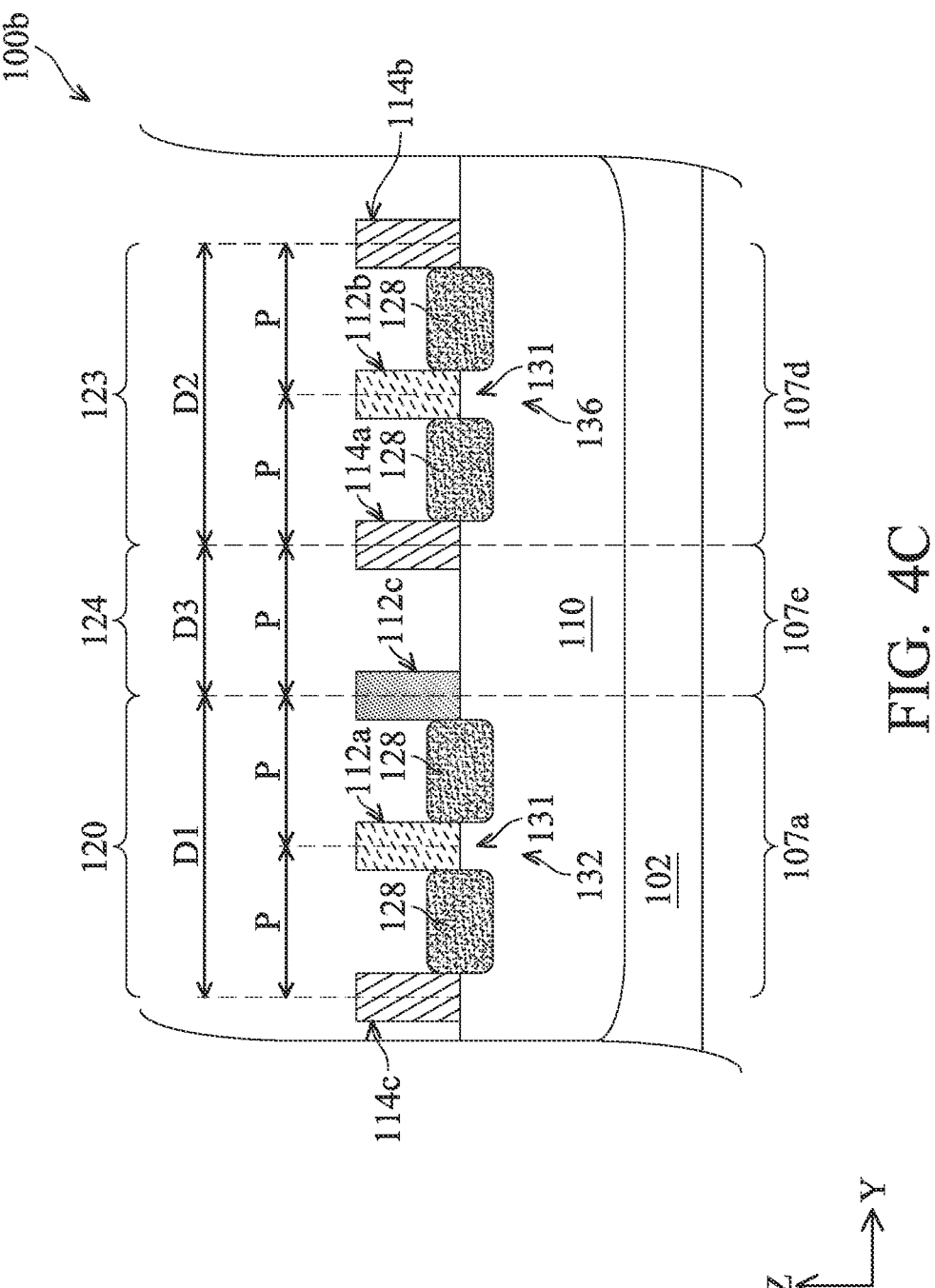

Now referring to FIGS. 3 and 4A-4C collectively, the present embodiments provide another example semiconductor structure 100b. The semiconductor structure 100b is discussed in reference to FIGS. 3 and 4A-4C, where FIG. 3 is a top view of the semiconductor structure 100b, and FIGS. 4A-4C are cross-sectional view of the semiconductor structure 100b taken along lines AA', BB', and CC, respectively, constructed according to various aspects of the present disclosure. The semiconductor structure 100b is similar to the semiconductor structure 100a in that the semiconductor structure 100b also includes the STD cell 120 and the STD cell 122 separated by the filler cell 124, where the filler cell 124 provides a transitional region over which the fin structures 106 and 107 extend continuously between the two STD cells. In this regard, components common in both the semiconductor structures 100a and 100b are labeled with the same reference numerals for the sake of simplicity.

In some embodiments, however, the IC layout of the semiconductor structure 100b differs from that of the semiconductor structure 100a in terms of the arrangement of the metal gate stacks 112 and/or the dielectric gates 114. For instances, referring to FIG. 3, the STD cell 120 adjoins the filler cell 124 on the metal gate stack 112c, while the STD cell 122 adjoins the filler cell 124 on the dielectric gate 114a. In other words, the dummy metal gate stack 112c separates the STD cell 120 from the filler cell 124, while the dielectric gate 114a separates the STD cell 122 from the filler cell 124.

In the depicted embodiments, the dummy metal gate stack 112c is configured with the same structure as and formed by the same process as the nearest functional metal gate stack, which is metal gate stack 112a. In this case, the dummy metal gate stack 112c is separated from the nearest metal gate stack 112a by a distance of 1*P.

In some embodiments, the semiconductor structure 100b further includes the STD cell 123, and the dielectric gate 114a extends partially to define a portion of the boundary between the STD cell 123 and the filler cell 124, with a remainder portion of such boundary being defined by the metal gate stack 112d. In some embodiments (not depicted), the dielectric gate 114a extends through an entirety of the boundary between the STD cell 123 and the filler cell 124.

Figure 5:
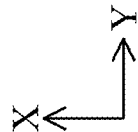
Figure 6A:
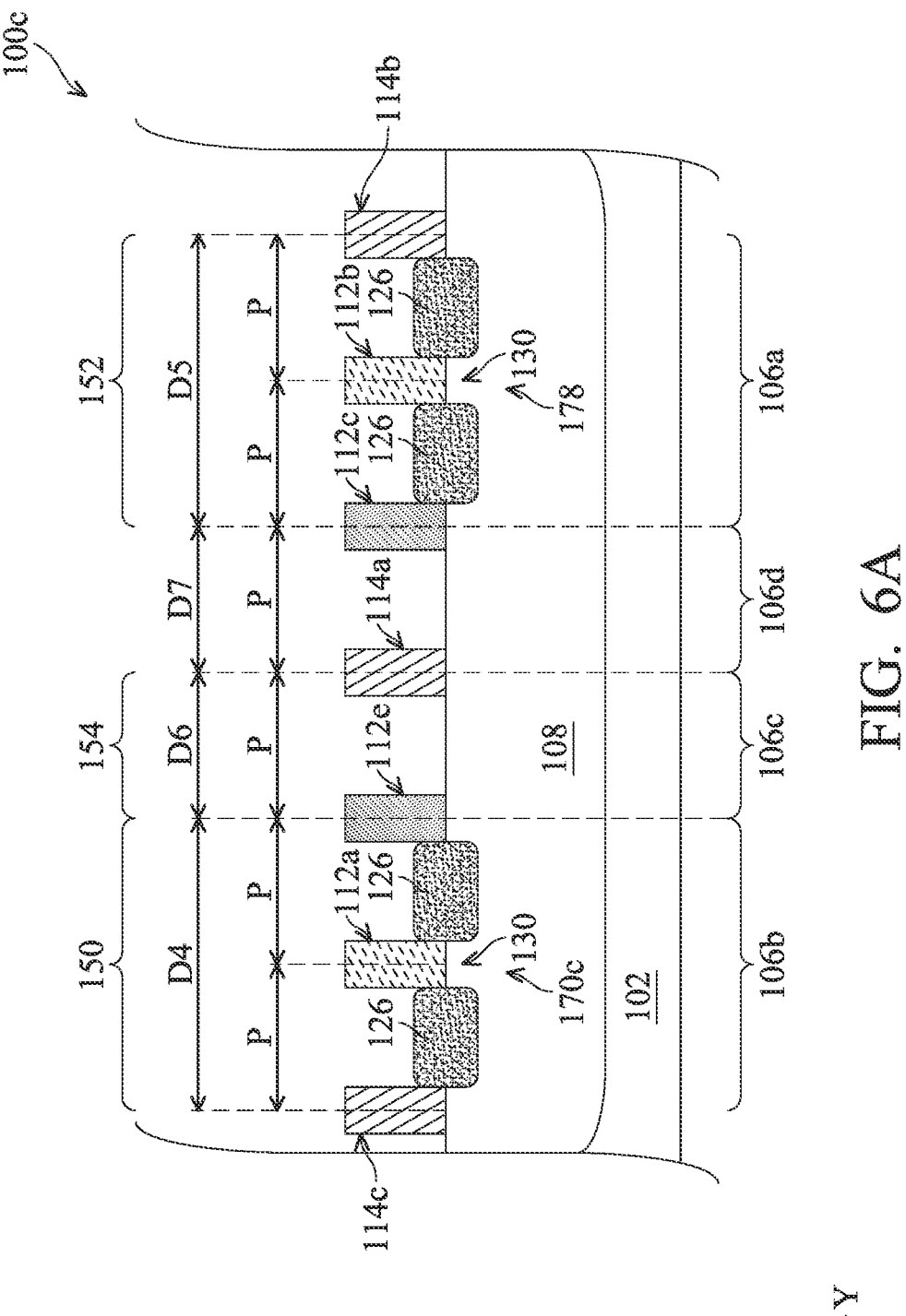
Figure 6B:
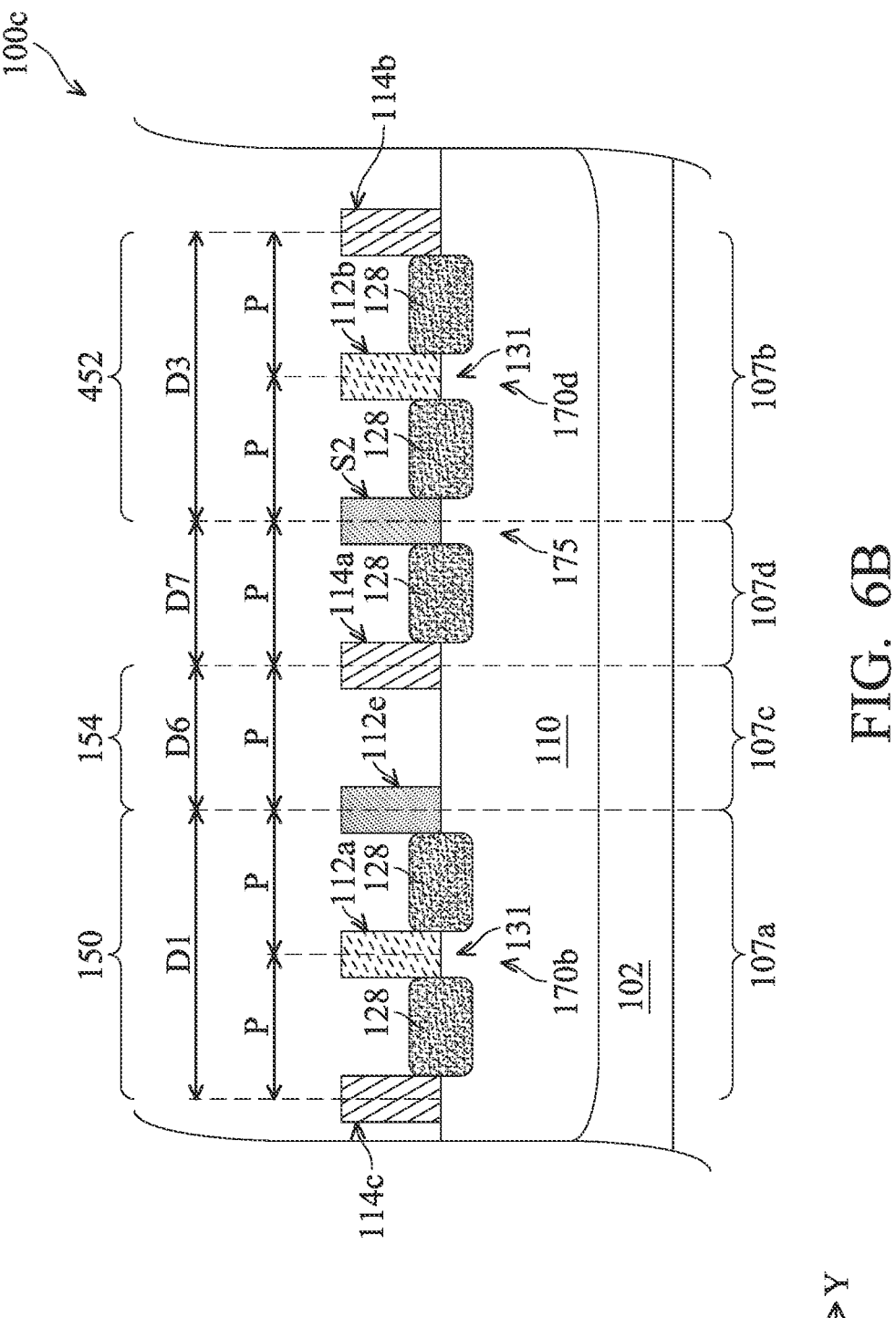
Figure 6C:
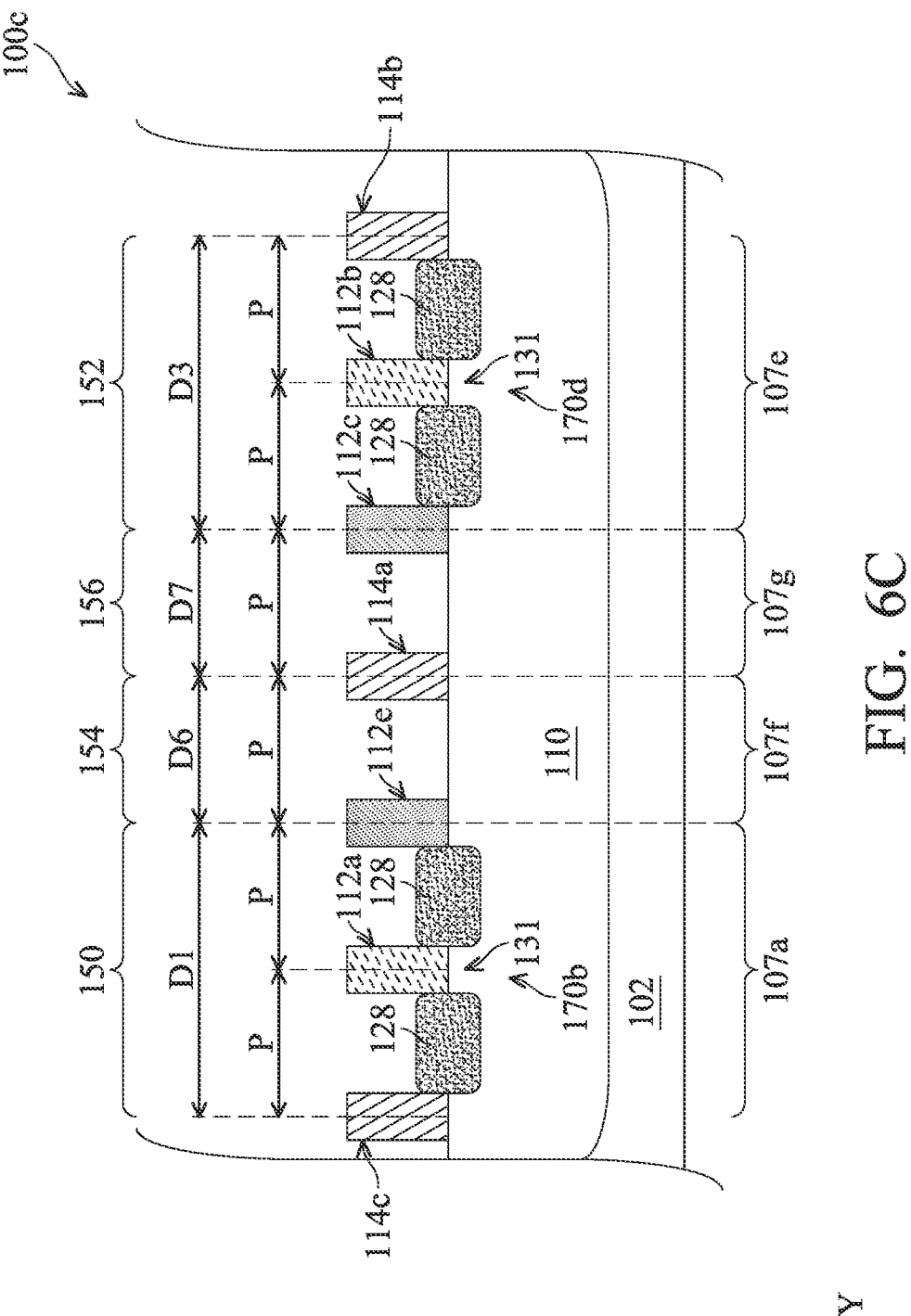
Figure 6D:
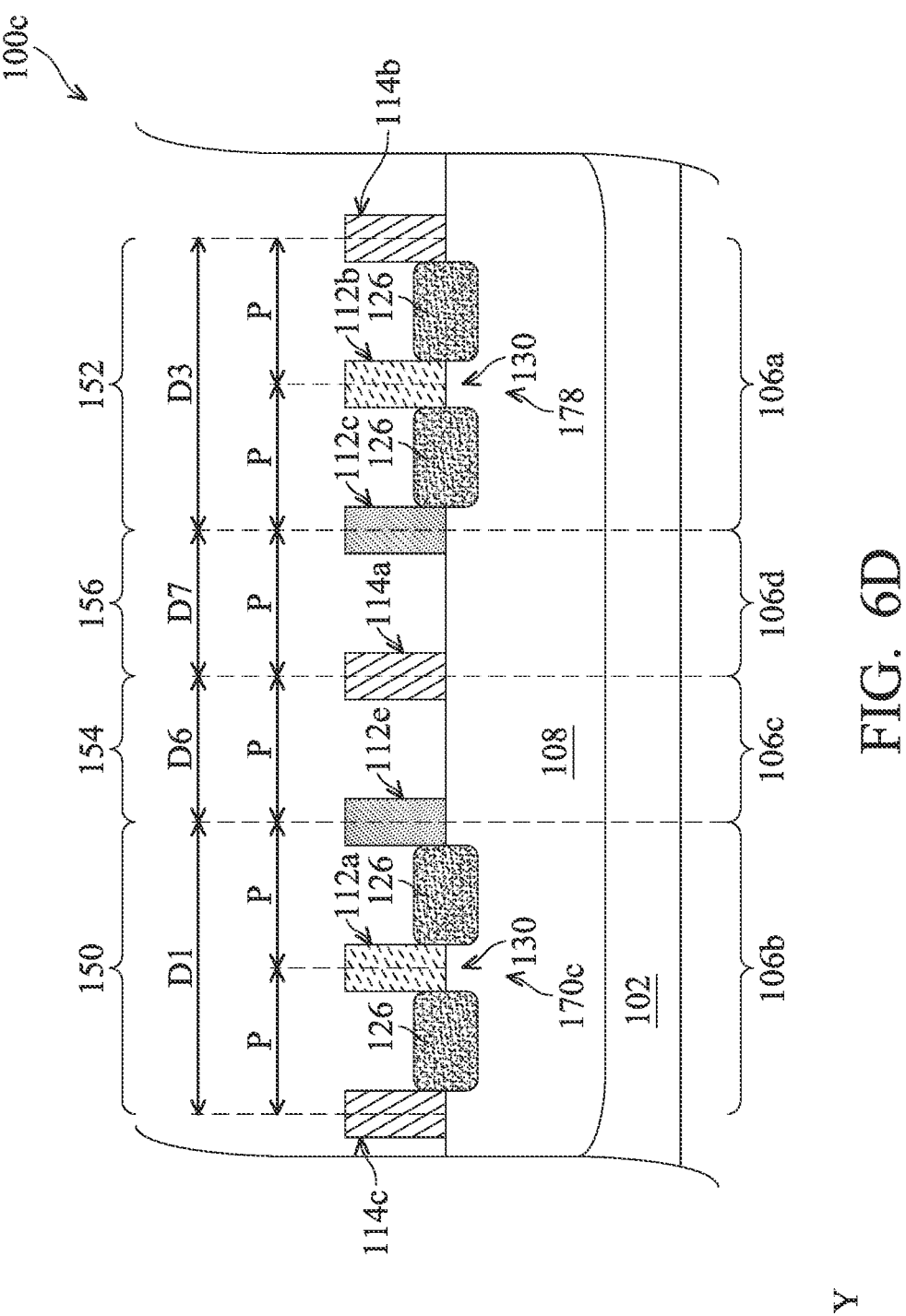
FIG. 6D is a cross-sectional view of the example semiconductor structure depicted in FIG. 5 along line DD', according to various aspects of the present disclosure.

Now referring to FIGS. 5 and 6A-6D collectively, the present embodiments further provide another example semiconductor structure 100c, where FIG. 5 is a top view of the semiconductor structure 100c, and FIGS. 6A-6D are cross-sectional view of the semiconductor structure 100c taken along lines AA', BB', CC, and DD', respectively, constructed according to various aspects of the present disclosure.

The semiconductor structure 100c includes a STD cell 150 and a STD cell 152 separated by a filler cell 154 and a filler cell 156 adjacent the filler cell 154 along the Y axis, where the filler cells 154 and 156 together provide a transitional region over which the fin structures 106 and 107 extend continuously between the STD cells 150 and 152. In the present embodiments, the STD cell 150 has a width D4 that is defined by 2*P, the STD cell 152 has a width D5 that is defined by 2*P, the filler cell 154 has a width D6 that is defined by P, and the filler cell 156 has a width D7 defined by P. In other words, the transitional region defined by each of the filler cells 154 and 156 spans a width about half of that of the adjacent STD cells. In addition, each filler cell in the semiconductor structure 100c is defined by a height that is the same as that of a nearest neighboring STD cell. For example, the filler cell 154 is defined by a height that is the same as that of the STD cell 150, and the filler cell 156 is defined by a height that is the same as that of the STD cell 152.

In the depicted embodiments, the STD cell 150 includes a first NFET 174, a PFET 172, and a second NFET 174 integrated into a functional circuit block, and the STD cell 152 includes a first PFET 176, an NFET 178, and a second PFET 176 (not depicted in FIG. 5 but is substantially the same in structure and function as the first PFET 176 and is formed by the portion 107b and the metal gate stack 112b). It is noted that, where applicable, components and dimensions of the semiconductor structures 100a and 100c are labeled with the same reference numerals for the sake of simplicity.

Similar to the semiconductor structures 100a and 100b, the semiconductor structure 100c includes fins having different widths across the STD cells along the Y axis. For example, in the P well 108, the portion 106a may be defined by a width T7, the portion 106b, 106e, and 106f may be defined by a width T8 that is less than the width T7, and the portions 106c and 106d extending from the portion 106a to the portion 106b and portion 106g extending from the portion 106a to the portion 106f may each be defined by a width T9. Similarly, in the N well 110, the portion 107a may be defined by a width T10, the portions 107b and 107d may each be defined by a width T11 that is less than the width T10, the portion 107c extending from the portion 107a to the portion 107d and the portions 107f and 107g extending from the portion 107a to the portion 107e may each be defined by a width T12. The widths T9 and T12 may be the same or different. In some embodiments, the fins disposed over the filler cells 154 and 156 may be defined by substantially the same widths, such as the portions 106*c* and 106*d*. In some embodiments, the fins disposed over the filler cells 154 and 156 may be defined by different widths, such as the portions 107*c* and 107*d*.

Portions of the active regions disposed in the filler cells 154 and 156 are configured to accommodate the differences in fin width across the STD cells 150 and 152. In the present embodiments, whether one filler cell, such as the filler cell 124 of the semiconductor structures 100*a* and 100*b*, or two filler cells, such as the filler cells 154 and 156 of the semiconductor structure 100*c*, are needed to accommodate the placement of two STD cells depends on the difference in fin width between the fins provided in adjacent STD cells. In some examples, if the difference between the width T7 and the width T8 or between the width T10 and T11 is greater than or equal to about 10 nm, two filler cells may be needed to accommodate the transition between the STD cells 150 and 152. If, however, such difference is less than about 10 nm, such as in the case for the semiconductor structures 100*a* and 100*b*, one filler cell may be sufficient to accommodate the transition.

In some embodiments, the IC layout of the semiconductor structure 100*c* differs from that of the semiconductor structure 100*a* in terms of the arrangement of the metal gate stacks 112 and/or the dielectric gates 114. For instance, the STD cell 150 adjoins the filler cell 154 on a metal gate stack 112*e*, and the STD cell 152 adjoins the filler cell 156 on the metal gate stack 112*c*, where the metal gate stack 112*e* is a dummy metal gate stack substantially the same as the metal gate stack 112*a* and the metal gate stack 112*c* is a dummy metal gate stack substantially the same as the metal gate stack 112*b*. In this regard, the metal gate stack 112*e* extends continuously to define a boundary of the STD cell 150 and the metal gate stack 112*c* extends continuously to define a boundary of the STD cell 152. Stated differently, the STD cell 150 has a first boundary defined by a dielectric gate (i.e., the dielectric gate 114*c*) and a second boundary defined by a metal gate stack (i.e., the metal gate stack 112*e*), and the STD cell 152 has a first boundary defined by a dielectric gate (i.e., the dielectric gate 114*b*) and a second boundary defined by a metal gate stack (i.e., the metal gate stack 112*c*). Furthermore, in the present embodiments, each filler cell has a first boundary defined by a metal gate stack and a second boundary defined by a dielectric gate. For example, the filler cell 154 has a first boundary defined by the metal gate stack 112*e* and a second boundary defined by the dielectric gate 114*a*, and the filler cell 156 has a first boundary defined by the dielectric gate 114*a* and a second boundary defined by the metal gate stack 112*c*.

In some embodiments, portions of the dummy metal gate stacks, such as the metal gate stacks 112*c* and 112*e*, may form FETs with active regions having a consistent width on either side of the metal gate stack. For example, a portion S1 of the metal gate stack 112*e* may form an NFET 173 with the portion 106*d* and a portion S2 of the metal gate stack 112*c* may form a PFET 175 with the portion 107*b*. In the depicted embodiments, the NFET 173 and the PFET 175 are disposed outside the STD cells 150 and 152 and may be configured to form STD cells having different layouts from those of the STD cells 150 and 152.

Figure 7:
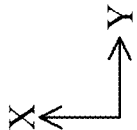
Figure 10:
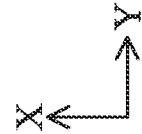
FIGS. 10, 12, 14, 16, 18A, 20, 22, 24, 26, 28, and 30 are top views of an example semiconductor structure at intermediate steps of the methods depicted in FIGS. 8 and/or 9, according to various aspects of the present disclosure.
Figure 11A:
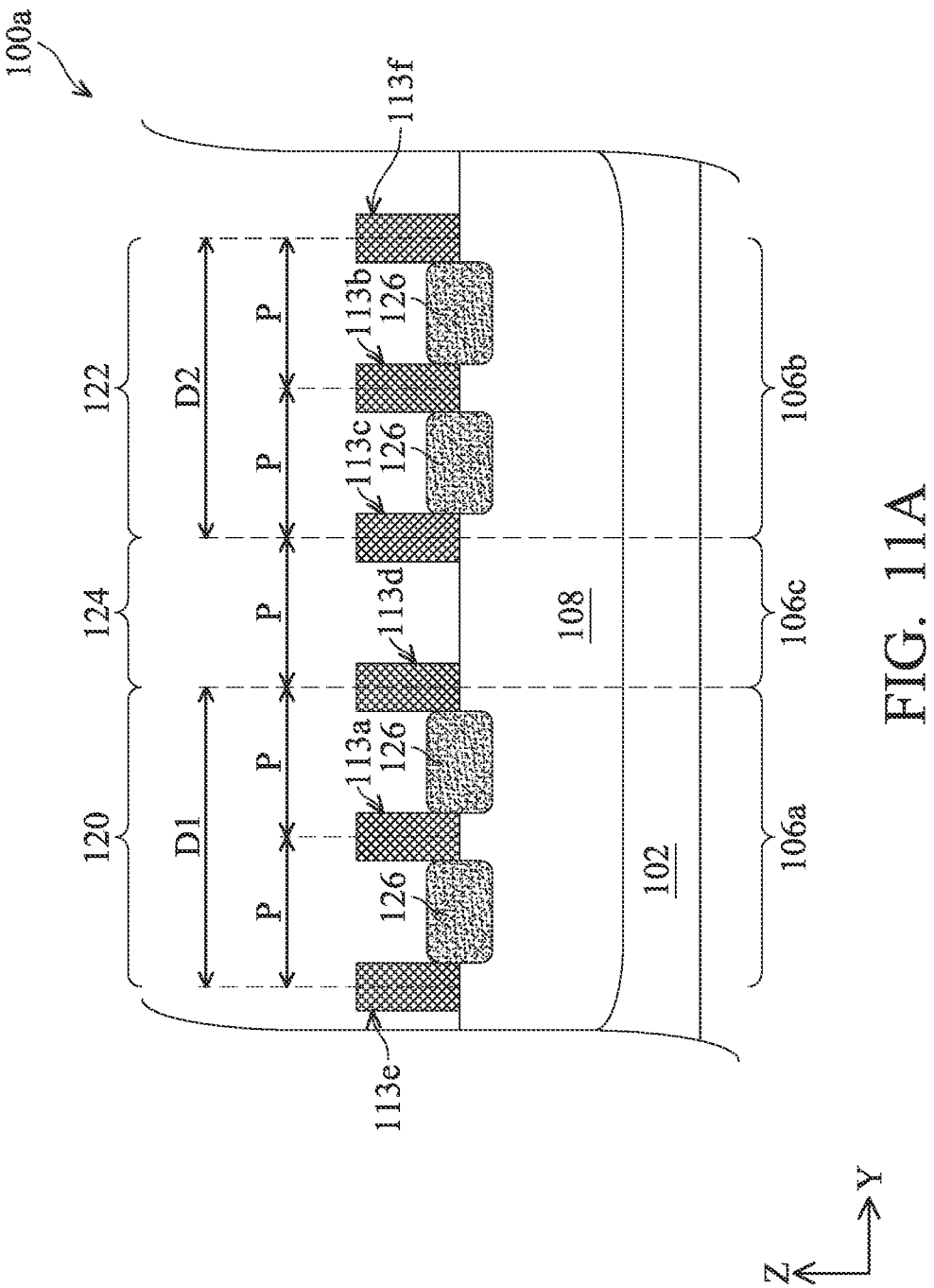
FIGS. 11A, 13A-13C, 15A-15C, 17A-17C, 19A-19C, 21A-21C, 23A-23C, 25A-25C, 27A-27C, 29A-29C, and 31A-31C are cross-sectional views of the example semiconductor structure taken along line AA' of FIGS. 10, 12, 14, 16, 18A, 20, 22, 24, 26, 28, and 30, respectively, at intermediate steps of the methods depicted in FIGS. 8 and/or 9, according to various aspects of the present disclosure.
Figure 11B:
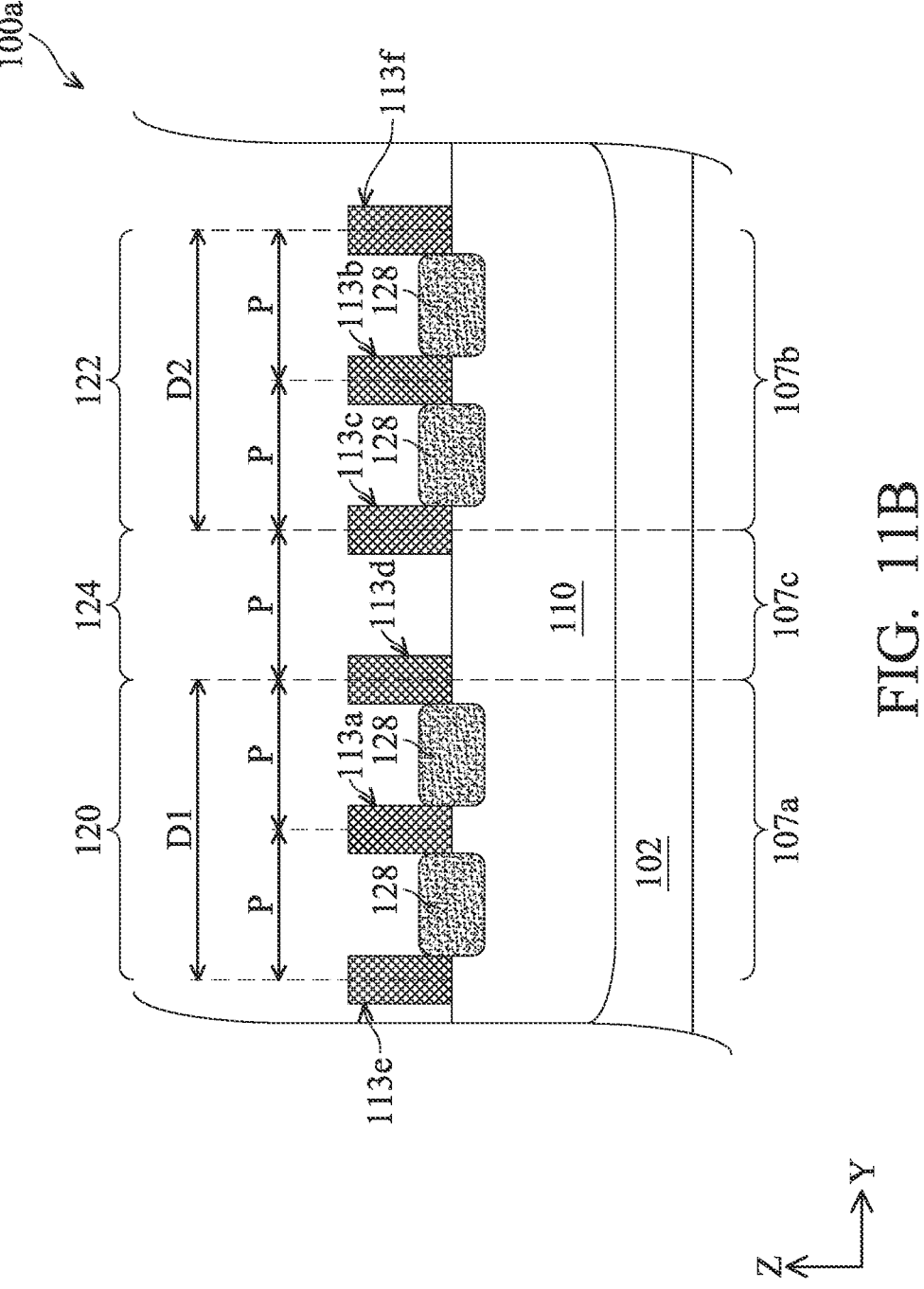
FIGS. 11B, 13D-13F, 15D-15F, 17D-17F, 19D-19F, 21D-21F, 23D-23F, 25D-25F, 27D-27F, 29D-29F, and 31D-31F are cross-sectional views of the example semiconductor structure taken along line BB' of FIGS. 10, 12, 14, 16, 18A, 20, 22, 24, 26, 28, and 30, respectively, at intermediate steps of the methods depicted in FIGS. 8 and/or 9, according to various aspects of the present disclosure.

In some embodiments, referring to FIG. 5, the dielectric gate 114*a* stops at a bottom of the STD cell 150 and a portion S3 extending from the dielectric gate 114*a* beyond the STD cell 150 may be configured as a dummy metal gate stack having similar functions as the metal gate stack 112*c* discussed above. Alternatively, referring to semiconductor structure 100*d* depicted in FIG. 7, which is substantially the same as the semiconductor structure 100*c* depicted in FIGS. 5-6D except that the dielectric gate 114*a* extends continuously beyond the boundary of the STD cell 150.

The semiconductor structures 100*a*-110*d* are merely examples and are not intended to limit the present disclosure beyond what is explicitly recited in the claims. Specific arrangement of the components of the semiconductor structures 100*a*-110*d* may depend on layout design considerations as well as overall ease of processability. In some embodiments, although the dielectric gates and the dummy metal gate stacks have different compositions, they may both function as inactive gate structures and may both be implemented as cell boundaries to separate adjacent active devices. In some embodiments, positions of the dielectric gates and the dummy metal gate stacks that define boundaries of the filler cell(s) may be interchangeable. In some embodiments, the filler cell(s) may have boundaries defined by only dielectric gates or only dummy metal gates.

Referring to FIGS. 8 and 9, the present embodiments provide a method 200 and a method 300 for forming one or more of the semiconductor structures 100*a*-100*d* according to some embodiments. For illustrative purposes, methods 200 and 300 are discussed with respect to the semiconductor structure 100*a* and in conjunction with FIGS. 10-31F, where FIGS. 10, 12, 14, 16, 18A, 18B, 20, 22, 24, 26, 28, and 30 are top views of the semiconductor structure 100*a*, FIGS. 11A, 13A-13C, 15A-15C, 17A-17C, 19A-19C, 21A-21C, 23A-23C, 25A-25C, 27A-27C, 29A-29C, and 31A-31C are cross-sectional views of the semiconductor structure 100*a* taken along line AA' of FIGS. 10, 12, 14, 16, 18A, 20, 22, 24, 26, 28, and 30, respectively, and FIGS. 11B, 13D-13F, 15D-15F, 17D-17F, 19D-19F, 21D-21F, 23D-23F, 25D-25F, 27D-27F, 29D-29F, and 31D-31F are cross-sectional views of the semiconductor structure 100*a* taken along line BB' of FIGS. 10, 12, 14, 16, 18A, 20, 22, 24, 26, 28, and 30, respectively. Additionally, FIGS. 18C-18E are top views of various embodiments of one or more semiconductor structures at intermediate steps of method 200 and/or method 300. In some embodiments, method 300 is implemented in place of one or more operations of method 200. Methods 200 and 300 are merely examples and are not intended to limit the present disclosure beyond what is explicitly recited in the claims. Additional operations can be provided before, during, and after methods 200 and 300 and some operations described can be replaced, eliminated, or moved around for additional embodiments of the methods.

Referring to FIGS. 8, 10, and 11A-11B, method 200 at operation 202 provides the semiconductor structure 100*a* formed over the substrate 102, which includes the P well 108 and the N well 110 alternately disposed along the X axis. In some examples, the P well 108 and the N well 110 may alternatively be referred as the p-type device region 108 and the n-type device region 110, respectively. In the present embodiments, the P well 108 and the N well 110 are configured to provide FETs, e.g., the PFETs 132 and 136 and the NFETs 134 and 138, suitable for forming the STD cells 120 and 122 arranged along the Y axis and separated by the filler cell 124.

Still referring to FIGS. 8, 10, and 11A-11B, method 200 at operation 204 forms a plurality of fins protruding from the substrate 102. In the present embodiments, the portions 106*a*-106*c* are formed over the P well 108 and the portions 107*a*-107*e* are formed over the N well 110. As discussed above, the fin structures 106 and 107 may be formed by any suitable method including, for example, performing selective epitaxial growth to form a semiconductor layer and subsequently patterning the semiconductor layer using one or more photolithography masks in a double-patterning or multi-patterning process. In some examples, the fin structures 106 and 107 may each include a stack of semiconductor layers configured to form a GAA FET.

In the present embodiments, the fin structures 106 and 107 are oriented lengthwise along the X axis and spaced from each other along the Y axis. As provided herein, the portions 106a, 106b, and 106c are formed to different widths, i.e., the widths T1, T2, and T3, respectively, and extend continuously along the Y axis across the STD cells 120 and 122 and the filler cell 124. Similarly, the portions 107a, 107b (or 107d), and 107c (or 107e) are formed to different widths, i.e., the widths T4, T5, and T6, respectively, and extend continuously along the Y axis across the STD cells 120 and 122 and the filler cell 124. Notably, the width T1 is configured to be greater than the width T2, such that the NFET 134 may be configured with properties different from those of the NFET 138, and the width T4 is configured to be greater than the width T5, such that the PFET 132 may be configured with properties different from those of the PFET 136. To maintain continuity between the active regions across the STD cells 120 and 122, the portions 106c and 107c (or 107e) are provided in the filler cell 124 as an inactive transitional region, thereby not providing any functional FETs.

Subsequently, method 200 at operation 206 forms a plurality of dummy gate structures 113a, 113b, 113c, 113d, 113e, and 113f (collectively referred to as dummy gate structures 113 for the sake of brevity) over the fin structures 106 and 107. The dummy gate structures 113 may alternatively be referred to as dummy gates, placeholder gates, or auxiliary patterns 113. Specifically, the dummy gate structure 113a is formed over the portions 106a and 107a in the interior region of the STD cell 120, the dummy gate structure 113b is formed over the portions 106b and 107b in the interior region of the STD cell 122, the dummy gate structures 113d and 113e are formed along boundaries of the STD cell 120, and the dummy gate structures 113c and 113f are disposed along boundaries of the STD cell 122. In this regard, the dummy gate structures 113c and 113d are disposed along boundaries of the filler cell 124.

In some embodiments, the dummy gate structures 113 may include a dummy gate electrode (not depicted separately) disposed over an optional dummy gate dielectric layer and/or an interfacial layer (not depicted separately). In the present embodiments, the dummy gate structures 113 are configured to be replaced with either a metal gate stack or a dielectric gate. The dummy gate structures 113 may be formed by a series of deposition and patterning processes. For example, the dummy gate structures 113 may be formed by depositing a polysilicon (poly-Si) layer over the substrate 102 and subsequently patterning the poly-Si layer via a series of photolithography and etching processes (e.g., a dry etching process).

Additionally, gate spacers 160 (depicted in FIGS. 13A-13F, for examples) are formed on sidewalls of the dummy gate structures 113 at operation 206. The gate spacers 160 may include a single-layer structure or a multi-layer structure and may include SiO and/or SiO$_2$, SiN, SiC, SiON, SiOC, SiCN, air, a low-k dielectric material, a high-k dielectric material (e.g., hafnium oxide (HfO$_2$), lanthanum oxide (La$_2$O$_3$), etc.), other suitable materials, or combinations thereof. Each spacer layer of the gate spacers 160 may be formed by first depositing a dielectric layer over the dummy gate structures 113 via a suitable deposition method (e.g., CVD and/or ALD) and subsequently removing portions of the dielectric layer in an anisotropic (e.g., directional) etching process (e.g., a dry etching process), leaving the gate spacers 160 on the sidewalls of each dummy gate structure 113.

Referring to FIGS. 8, 10, and 11A-11B, method 200 at operation 208 forms the S/D features in the fin structures 106 and 107. In the present embodiments, method 200 forms the n-type S/D features 126 in the portions 106a and 106b and the p-type S/D features 128 in the portions 107a, 107b, and 107d. As the portions 106c, 107c, and 107e are not configured to form any active FETs, no S/D features are formed therein. In some embodiments, method 200 first form S/D recesses in the portions 106a, 106b, 107a, and 107b, and subsequently form the n-type S/D features 126 and the p-type S/D features 128 separately by one or more epitaxial processes discussed in detail above. In some embodiments, a first patterned masking element (not depicted) may be formed over the N well 110 when forming the n-type S/D features 126. Similarly, a second patterned masking element (not depicted) may be formed over the P well 108 when forming the p-type S/D features 128.

Figure 12:
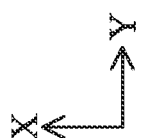
Figure 13C:
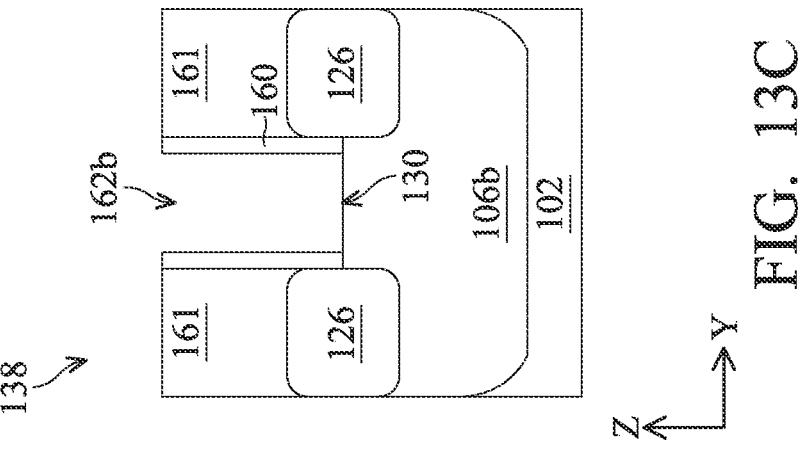
Figure 13B:
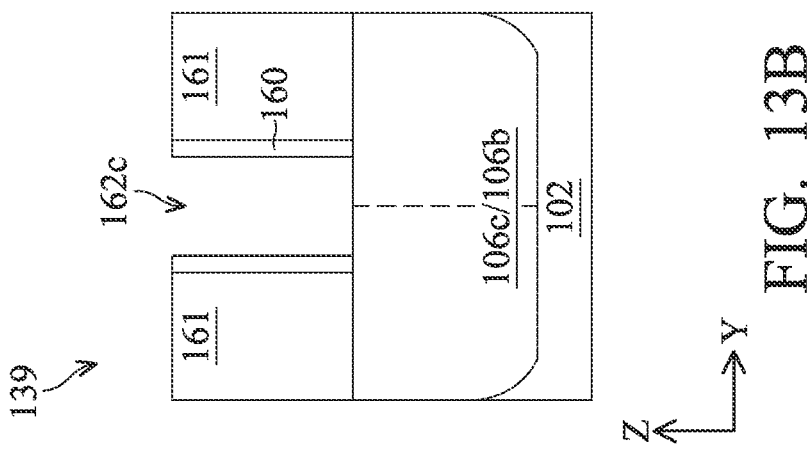
Figure 13A:
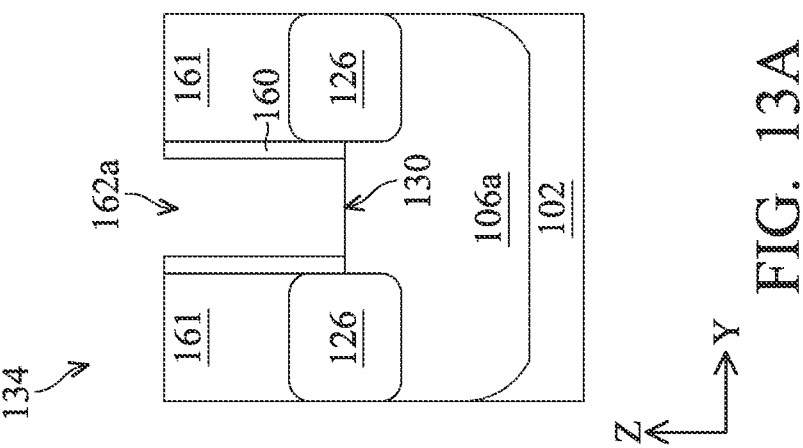
Figure 13F:
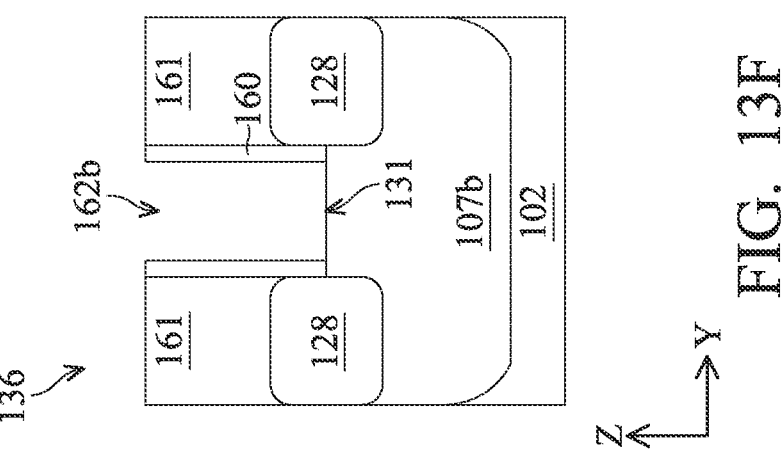
Figure 13E:
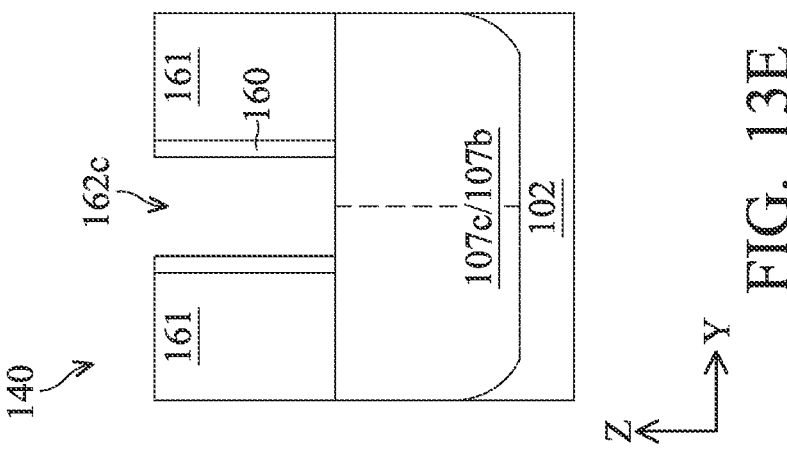
Figure 13D:
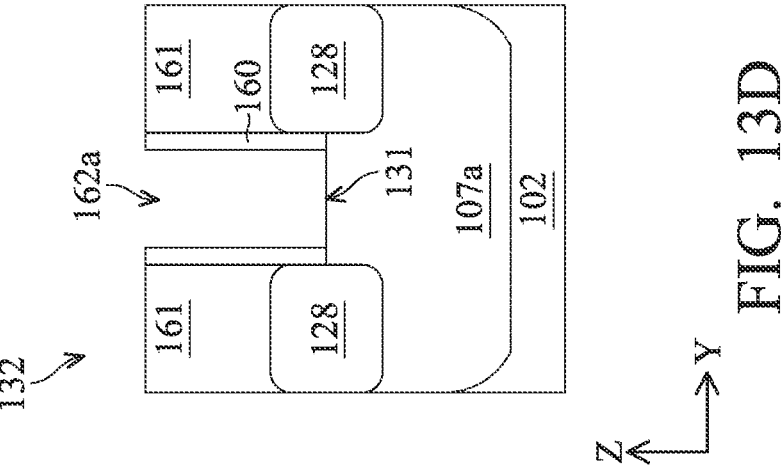
Figure 14:
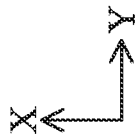
Figure 15C:
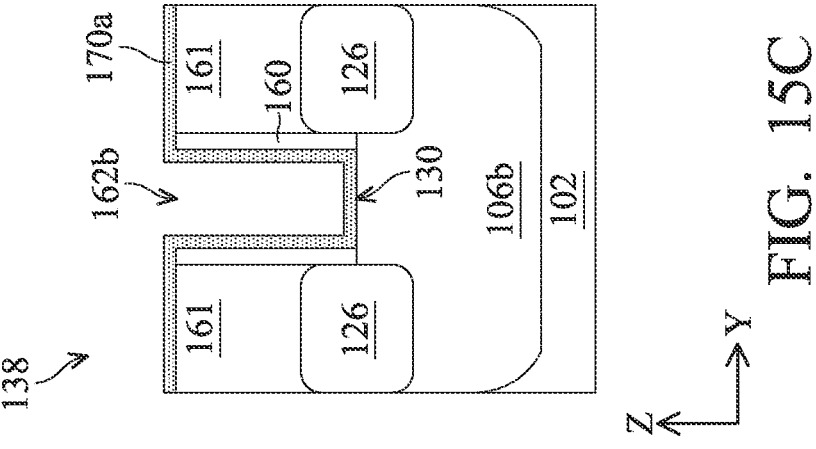
Figure 15B:
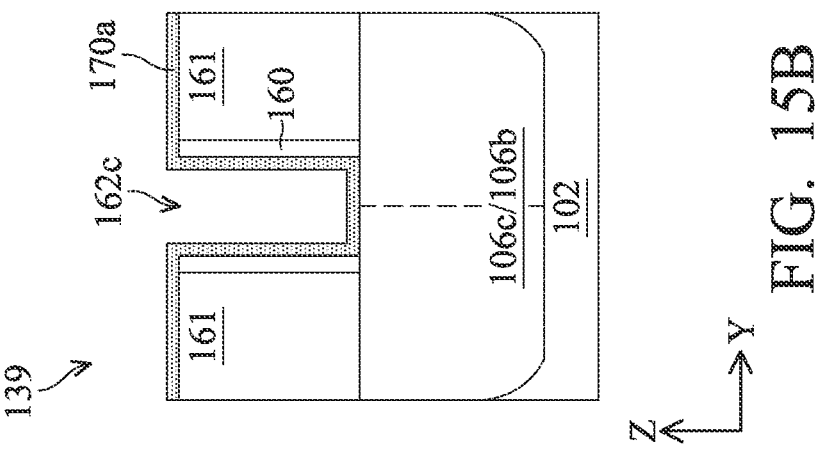
Figure 15A:
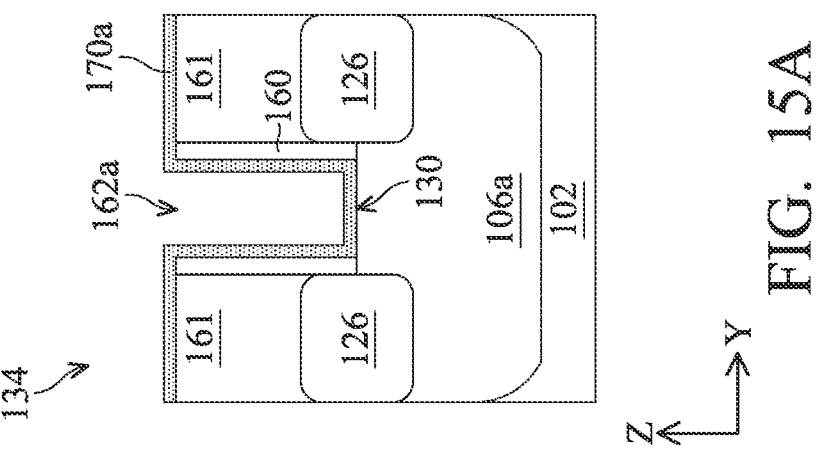
Figure 15F:
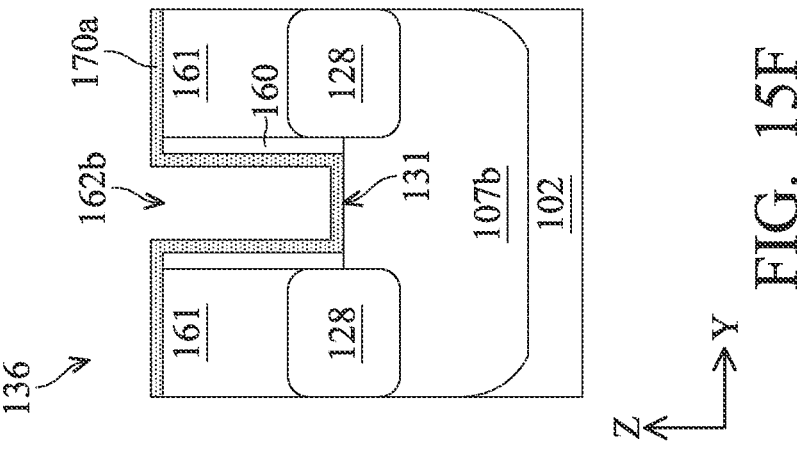
Figure 15E:
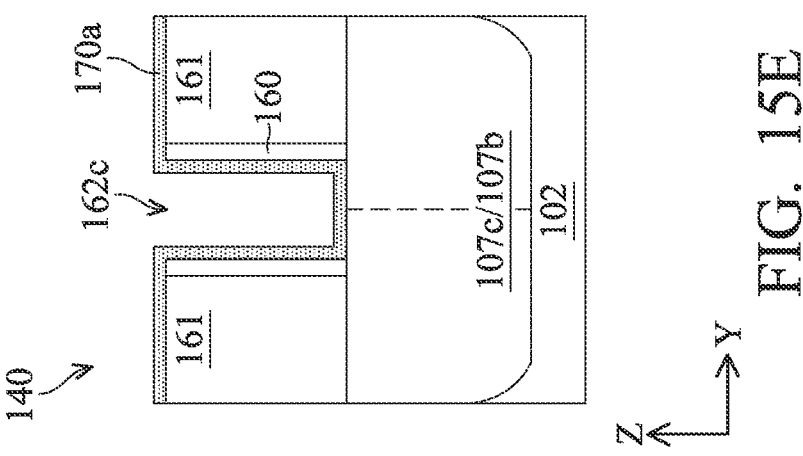
Figure 15D:
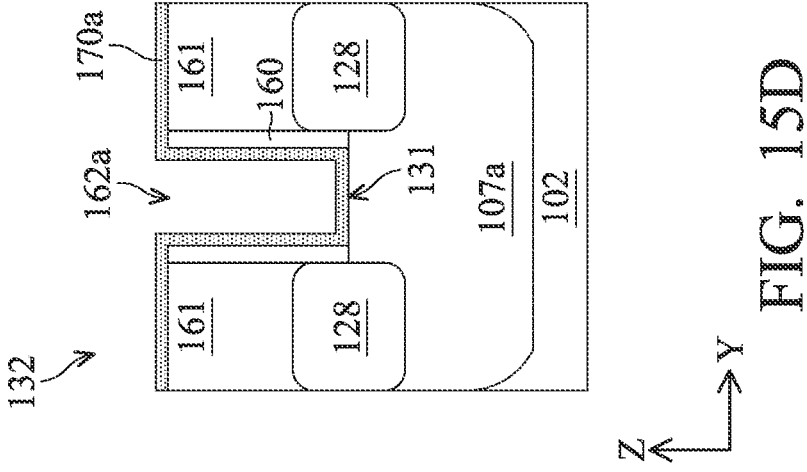
Figure 16:
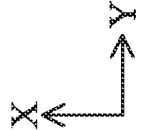
Figure 17C:
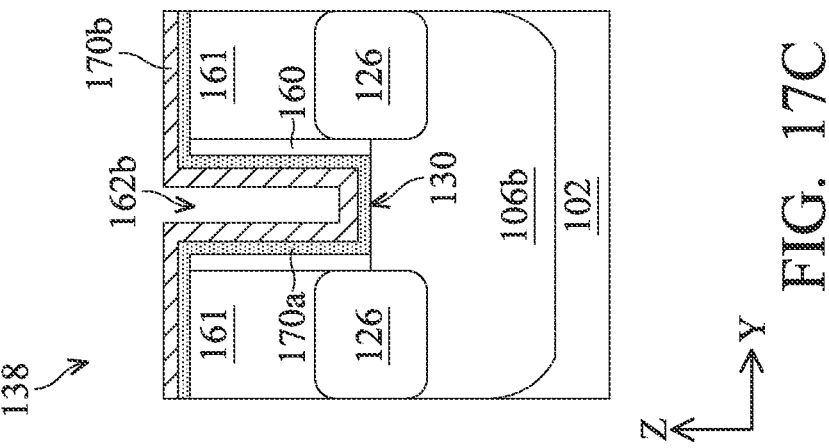
Figure 17B:
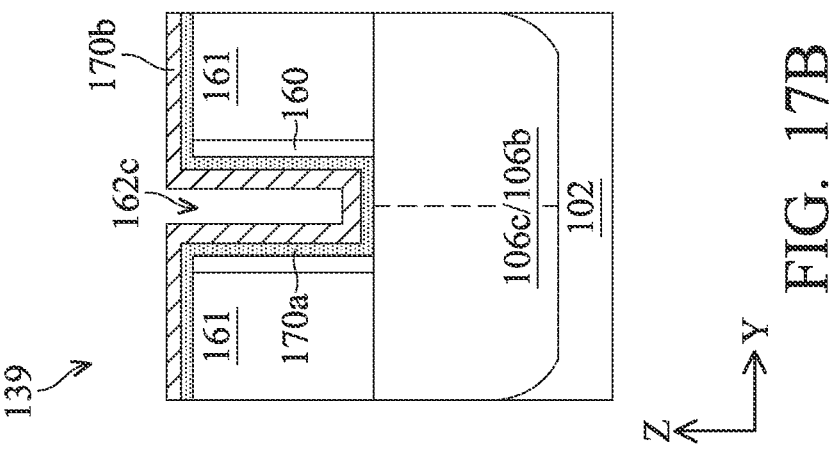
Figure 17A:
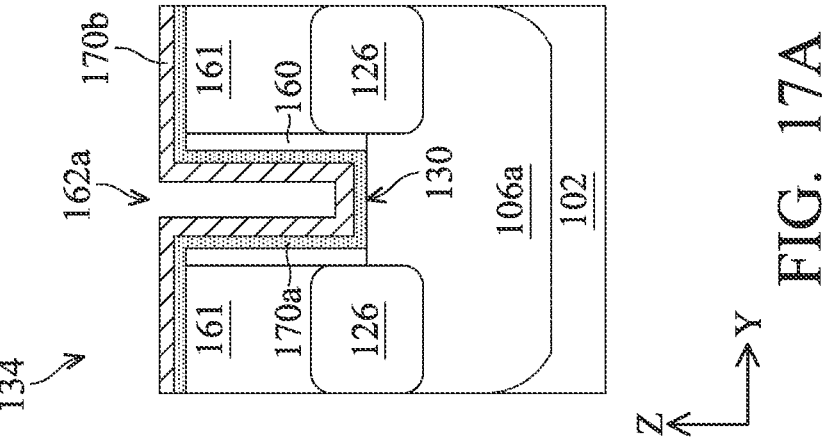
Figure 17F:
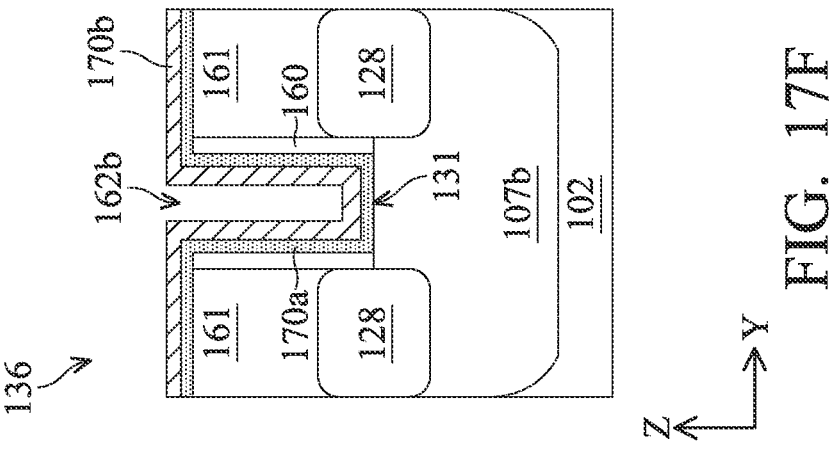
Figure 17E:
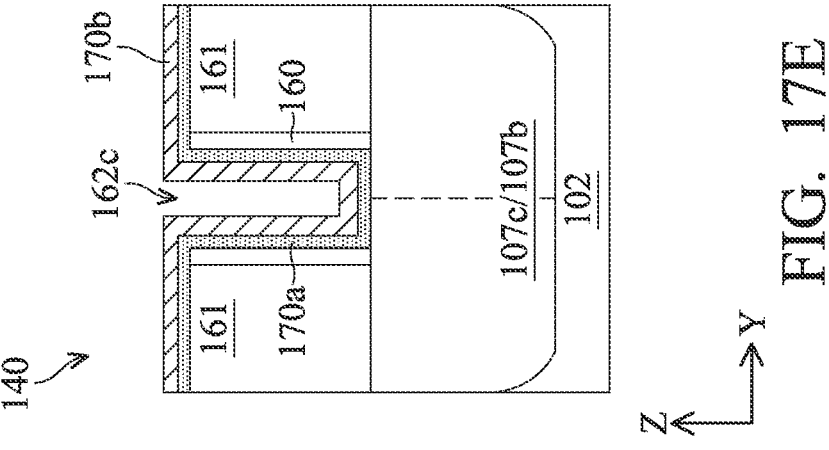
Figure 17D:
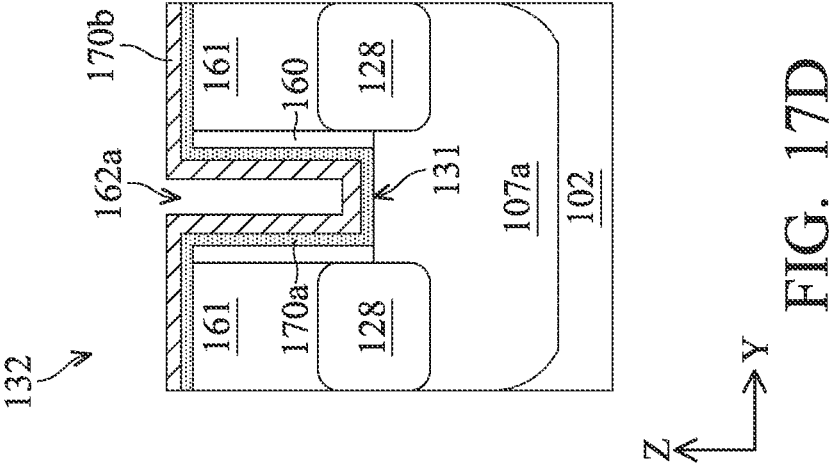

Thereafter, referring to FIGS. 8 and 12, method 200 at operation 210 replaces some of the dummy gate structures 113 with the dielectric gates 114. In the depicted embodiments, the dummy gate structures 113d, 113e, and 113f are replaced with the dielectric gates 114a, 114c, and 114b, respectively, while the dummy gate structures 113a-113c remain over the substrate 102.

In some embodiments, an interlayer dielectric (ILD) layer 161 is first formed over the substrate 102 before forming the dielectric gates 114. Subsequently, a patterned masking element (not depicted) configured to expose the dummy gate structures 113d-113f is formed over the ILD layer 161. The masking element may include at least a photoresist (PR) layer that can be patterned via a series of photolithography processes. The masking element may further include a middle layer and a bottom anti-reflective coating (BARC) under the PR layer to facilitate the patterning process. In some embodiments, patterning the masking element includes depositing the masking element over the ILD layer 161, exposing the PR layer of the masking element to a light source through a photomask to form a latent image in the PR layer, optionally baking the exposed PR layer, developing the exposed PR layer using a suitable solvent to form a patterned PR layer, and etching the underlying middle layer and BARC, if included, using the patterned PR layer as an etch mask to form the patterned masking element. The patterned masking element may be used as an etch mask for removing the dummy gate structure 113d-113f from the semiconductor structure 100a to form gate trenches (not depicted), after which the patterned masking element is removed by a suitable method, such as plasma ashing and/or resist stripping. Then, a dielectric material, such as silicon nitride, may be deposited in the gate trenches and planarized to form the dielectric gates 114a-114c. Because the dielectric gates 114a-114c are disposed on one or more boundaries of the STD cells 120 and/or 122, they are configured to isolate device regions of adjacent STD cells and may be alternatively referred to as continuous poly on diffusion edges, or CPODE, in some instances. Accordingly, the process of forming the dielectric gates 114a-114c may be referred to as a CPODE replacement process.

The embodiments discussed above depicts a CPODE-first process during which the CPODE replacement process is implemented before forming the metal gate stacks 112a-112c. It is noted that the present disclosure may also provide a CPODE-last process during which the dielectric gates 114a-114c are formed after forming the metal gate stacks 112a-112c. The following disclosure is discussed in view of the CPODE-first process for illustrative purposes. In some embodiments, implementing the CPODE-first process allows edges (along the X axis) of two components of a patterned masking element to be aligned along a single dielectric gate, e.g., the dielectric gate 114a depicted herein, for improved processability and reduced defects during a metal gate replacement process as will be discussed in detail below.

Subsequently, method 200 at operation 212 implements a series of processes to replace the remaining dummy gate structures 113 with the metal gate stacks 112. An example process flow for forming the metal gate stacks 112, namely the metal gate stacks 112a-112c, is depicted by method 300 of FIG. 9. In the present embodiments, portions of the metal gate stacks 112a-112c formed over the P well 108 in the STD cell 120, the STD cell 122, and the filler cell 124, respectively, are depicted in cross-sectional views of FIGS. 13A-13C, 15A-15C, 17A-17C, 19A-19C, 21A-21C, 23A-23C, 25A-25C, 27A-27C, 29A-29C, and 31A-31C, and portions of metal gate stacks 112a-112c formed over the N well 110 in the STD cell 120, the STD cell 122, and the filler cell 124, respectively, are depicted in cross-sectional views of FIGS. 13D-13F, 17D-17F, 19D-19F, 21D-21F, 23D-23F, 25D-25F, 27D-27F, 29D-29F, and 31D-31F.

In the present embodiments, the metal gate stack 112a engages with the portion 106a to form the NFET 134 and with the portion 107a to form the PFET 132, the metal gate stack 112b engages with the portion 106b to form the NFET 138 and with the portion 107b to form the PFET 136, and the metal gate stack 112c, i.e., the dummy metal gate stack 112c, engages with the portions 106b and 106c in inactive region 139 of the P well 108 and with the portions 107b and 107c in inactive region 140 of the N well 110 without forming any functional or active device.

Referring to FIGS. 9, 12, and 13A-13F, method 300 at operation 302 removes the dummy gate structures 113a, 113b, and 113c to from gate trenches 162a, 162b, and 162c (collectively referred to as gate trenches 162 for the sake of brevity), respectively, between the gate spacers 160. In the present embodiments, the dummy gate structures 113a-113c are removed from the semiconductor structure 100a via one or more etching process (e.g., a dry etching process). In some embodiments, the etching process may be a selective etching process that removes the dummy gate structures 113a-113c without removing, or substantially removing, the dielectric gates 114a-114c.

Referring to FIGS. 9, 14, and 15A-15F, method 300 at operation 304 forms a gate dielectric layer 170a in the gate trenches 162. In the present embodiments, the gate dielectric layer 170a is deposited conformally over the semiconductor structure 100a. The gate dielectric layer 170a may include a high-k dielectric material (and thus may be referred to as a high-k dielectric layer), such as hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric material, or combinations thereof. A high-k dielectric material generally refers to dielectric materials having a high dielectric constant, for example, greater than that of silicon oxide ($k\approx3.9$). In some embodiments, the gate dielectric layer 170a includes a dielectric material, such as SiO and/or $SiO_2$ or other suitable dielectric material. The gate dielectric layer 170a may be formed using any suitable deposition process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition process, or combinations thereof. In some embodiments, an interfacial layer (not depicted) is formed over the semiconductor structure 100a before forming the gate dielectric layer 170a, such that the interfacial layer is disposed between the gate dielectric layer 170a and fin structures 106 and 107. The interfacial layer may include a dielectric material, such as SiO and/or $SiO_2$, and is formed by any of the processes described herein, such as by thermal oxidation. In some embodiments, the interfacial layer is a portion of dummy gate structures 113 that is not removed when forming the gate trenches 162.

Referring to FIGS. 9, 16, and 17A-17F, method 300 at operation 306 forms a gate dielectric layer 170b over the gate dielectric layer 170a in the gate trenches 162. In the present embodiments, the gate dielectric layer 170b is deposited conformally over the semiconductor structure 100a. The gate dielectric layer 170b may include any suitable dielectric material provided herein (see discussion above for the gate dielectric layer 170a). However, in the present embodiments, the gate dielectric layer 170b has a composition different from that of the gate dielectric layer 170a, such that it is configured to provide a threshold voltage (V t; alternatively referred to as the turn-on voltage) different from the gate dielectric layer 170a. The gate dielectric layer 170b may be formed by any suitable method provided herein.

Referring to FIGS. 9, 18A, and 19A-19F, method 300 at operation 308 patterns the gate dielectric layer 170b, such that it remains over certain portions of the semiconductor structure 100a. In the depicted embodiments, the patterned gate dielectric layer 170b remains over the device region of the NFET 134, the device region of the PFET 136, and the inactive region 140 but is removed from the device region of the NFET 138, the inactive region 139, and the device region of the PFET 132. In the present embodiments, a patterned masking element 180 that includes components 180a, 180b, and 180c is formed over the gate dielectric layer 170b, where the patterned masking element 180 is configured to mask device regions (and the inactive region) over which the gate dielectric layer 170b is to remain. In the depicted embodiments, the components 180a and 180c are configured to mask the device region of the NFET 134 in the STD cell 120, and the component 180b is configured to mask the inactive region 140 in the filler cell 124 and the device region of the PFET 136 in the STD cell 122. The patterned masking element 180 may be similar to the patterned masking element in structure and methods of formation as discussed in detail above with respect to operation 210. For example, the patterned masking element 180 may include at least a PR layer patternable by a series of photolithography processes.

Subsequently, referring to FIGS. 19A-19F, method 300 at operation 308 removes the portions of the gate dielectric layer 170b by a suitable etching process (e.g., a dry etching process, a wet etching process, a reactive ion etching, or RIE, process, or combinations thereof) using the patterned masking element 180 as an etch mask. Following the etching process, the patterned masking element 180 may then be removed from the semiconductor structure 100a by any suitable method, such as plasma ashing and/or resist stripping.

Figure 18A:
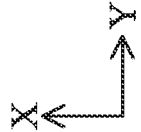
Figure 18C:
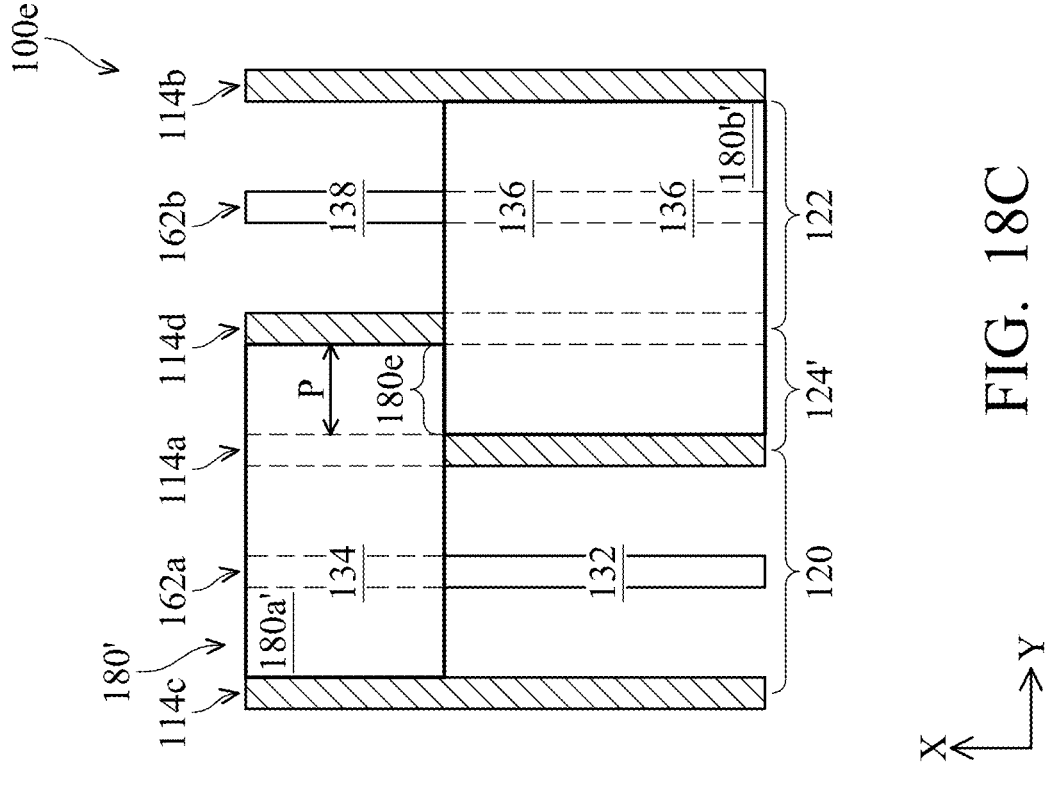
FIGS. 18B, 18C, 18D, and 18E are top views of various embodiments of an example semiconductor structure at intermediate steps of the methods depicted in FIGS. 8 and/or 9.
Figure 18B:
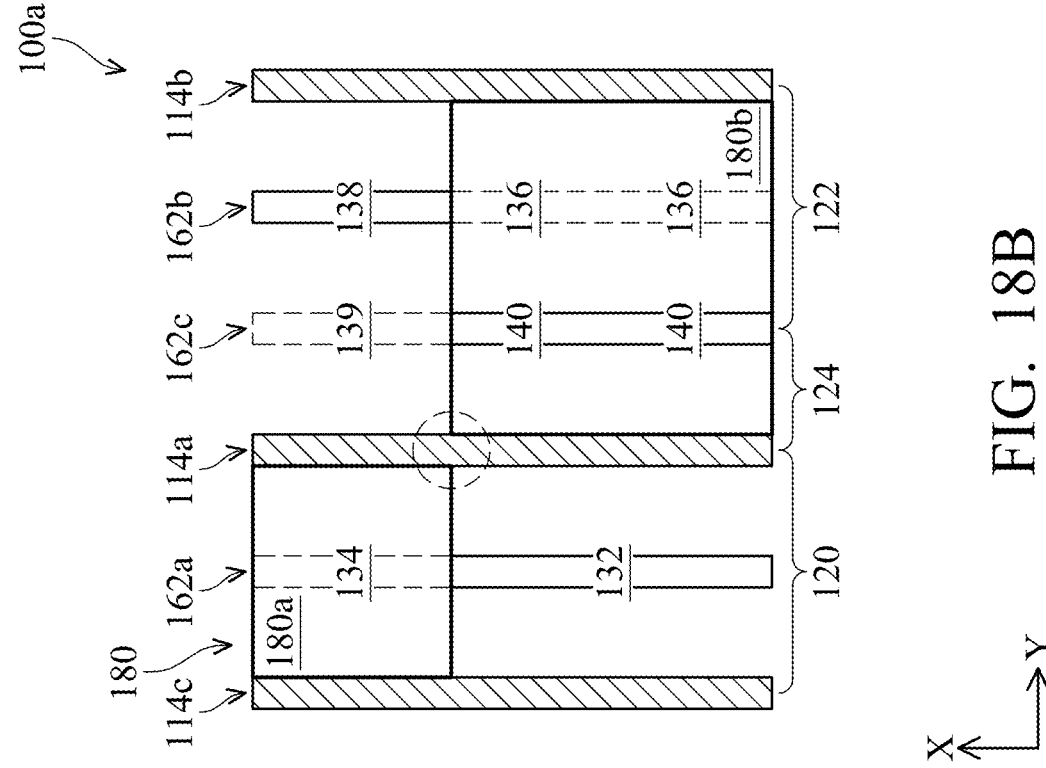
Figures 18D, 18E:
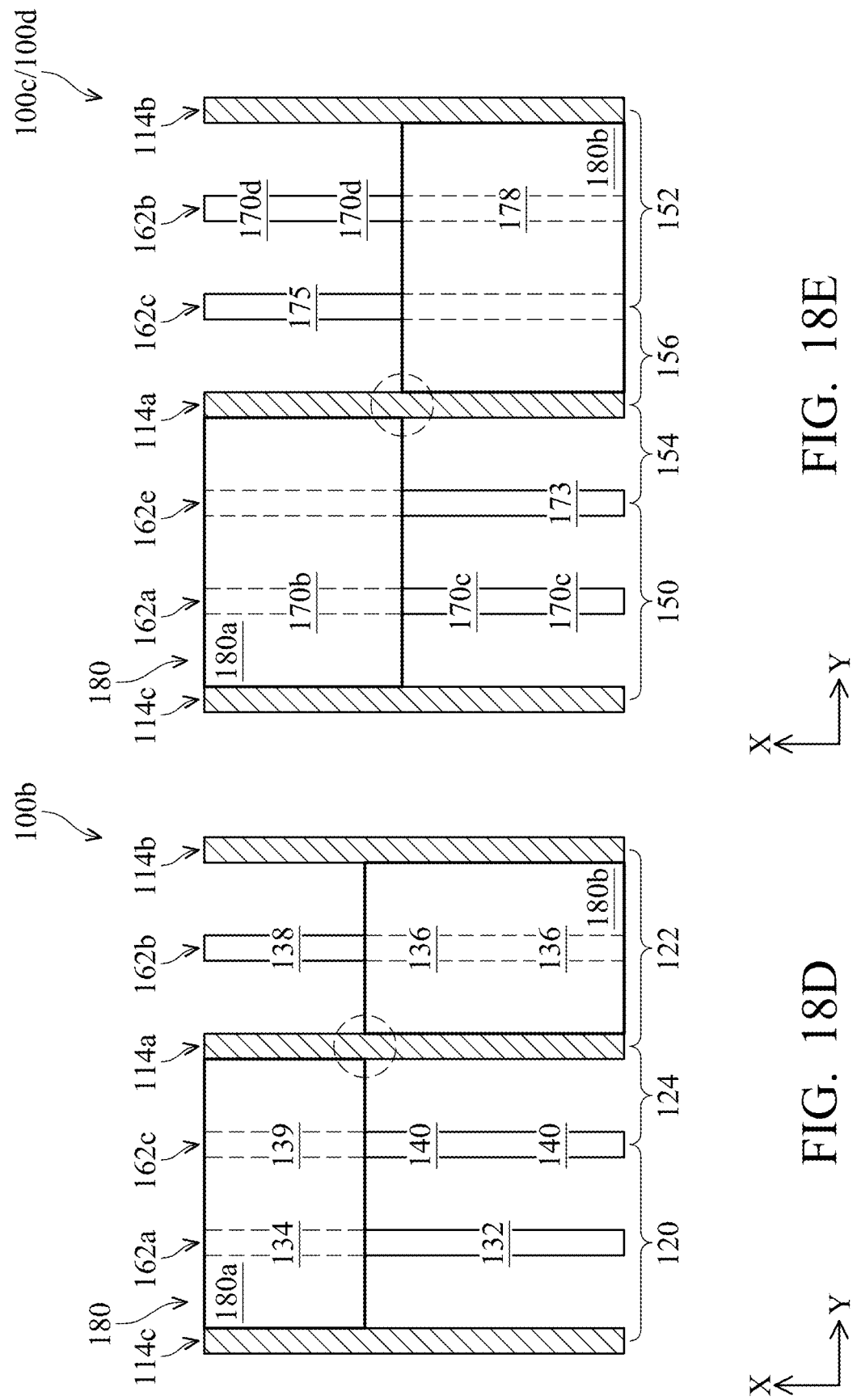
Figure 19C:
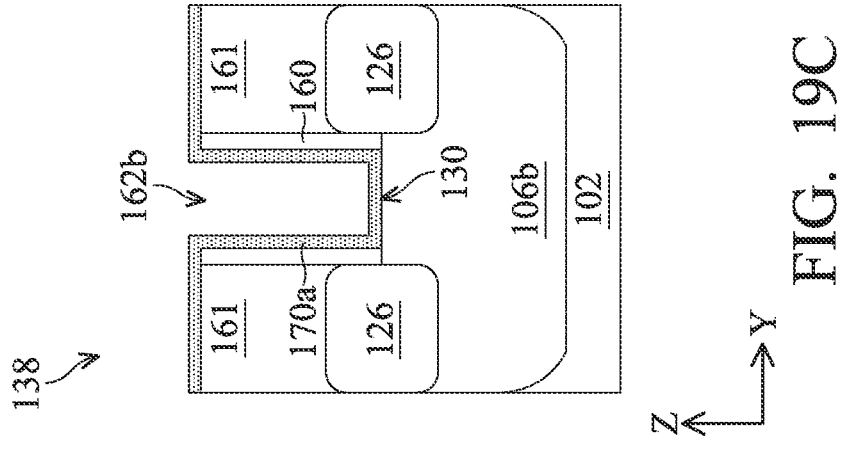
Figure 19B:
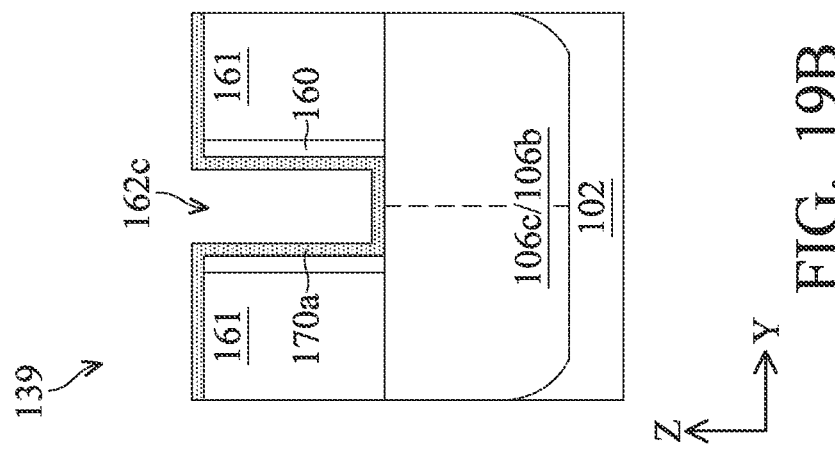
Figure 19A:
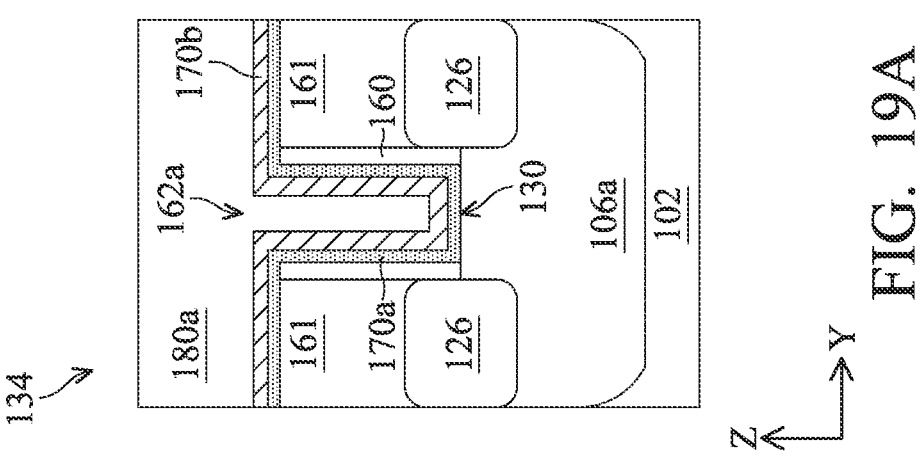
Figure 19F:
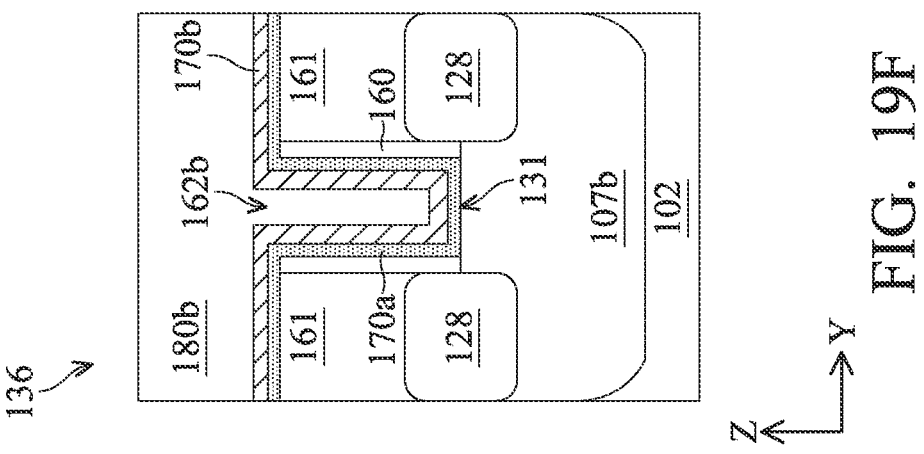
Figure 19E:
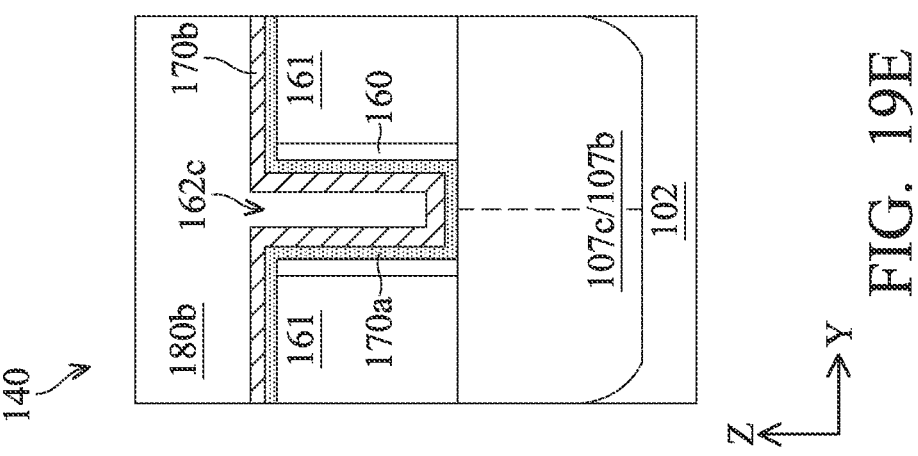
Figure 19D:
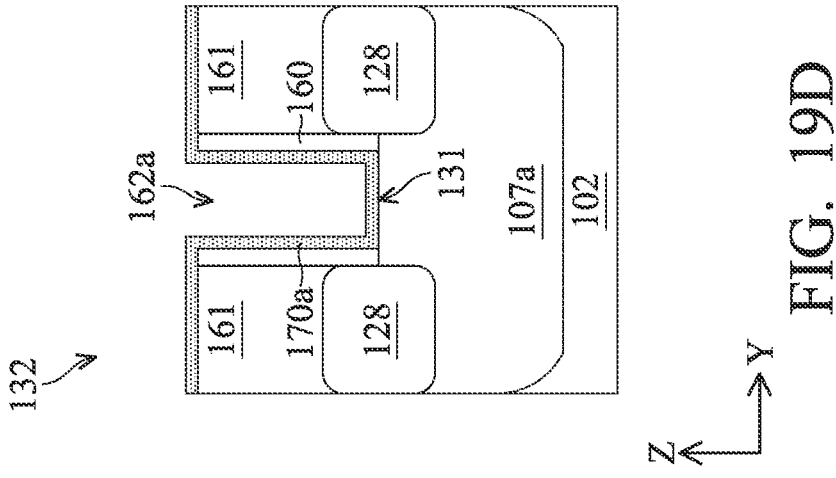
Figure 20:
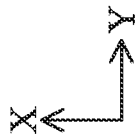
Figure 21C:
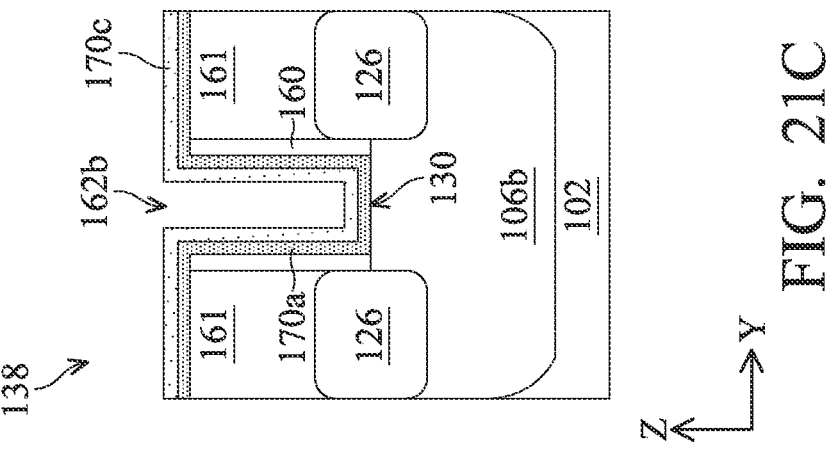
Figure 21B:
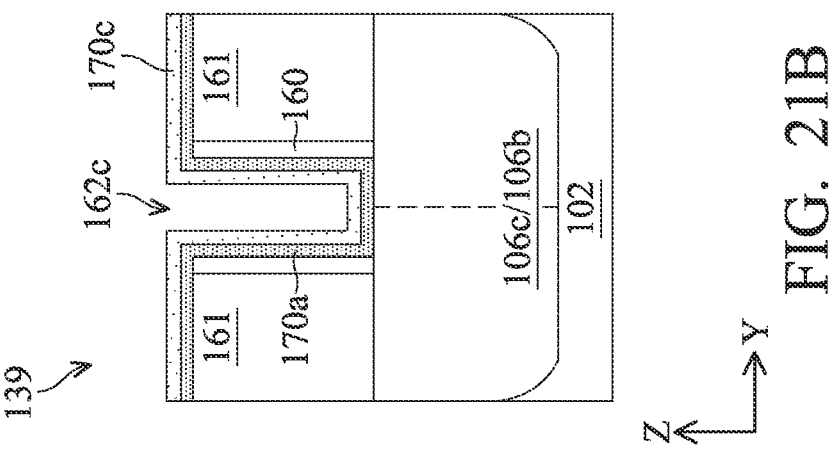
Figure 21A:
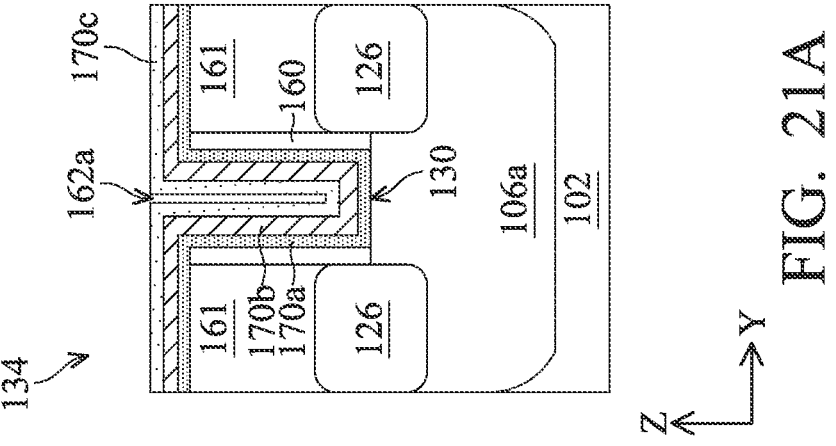
Figure 21F:
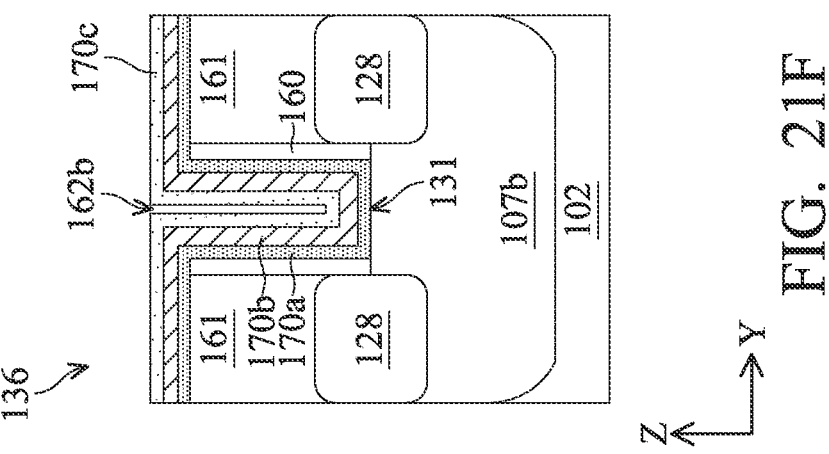
Figure 21E:
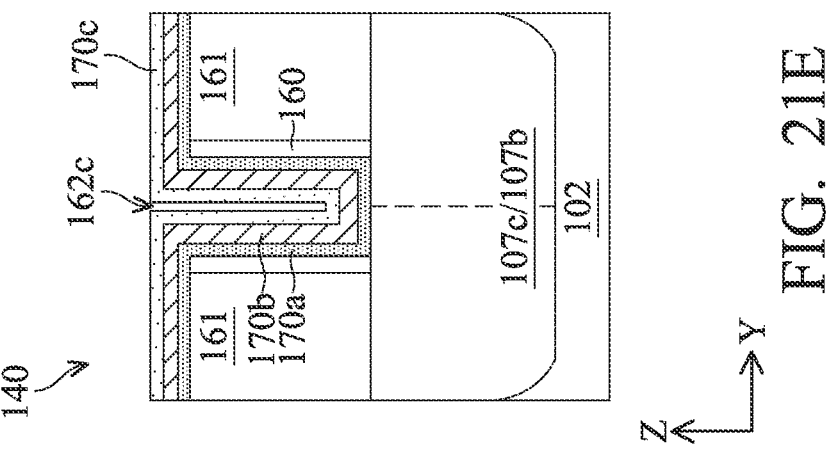
Figure 21D:
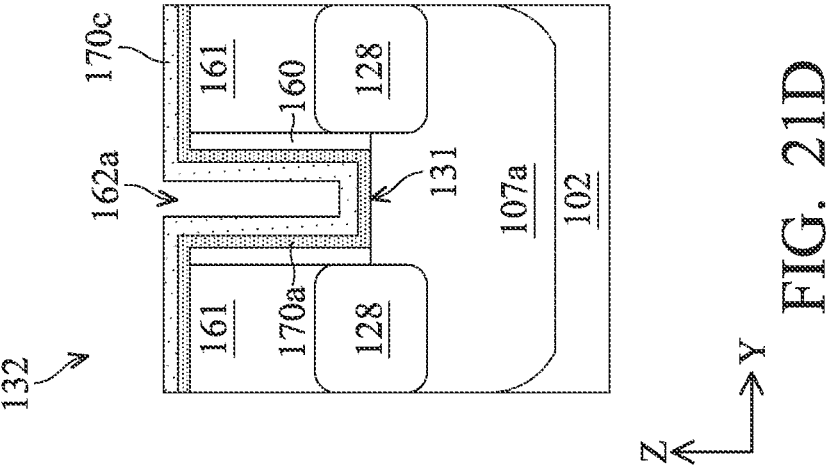
Figure 22:
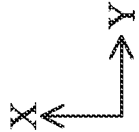
Figure 23C:
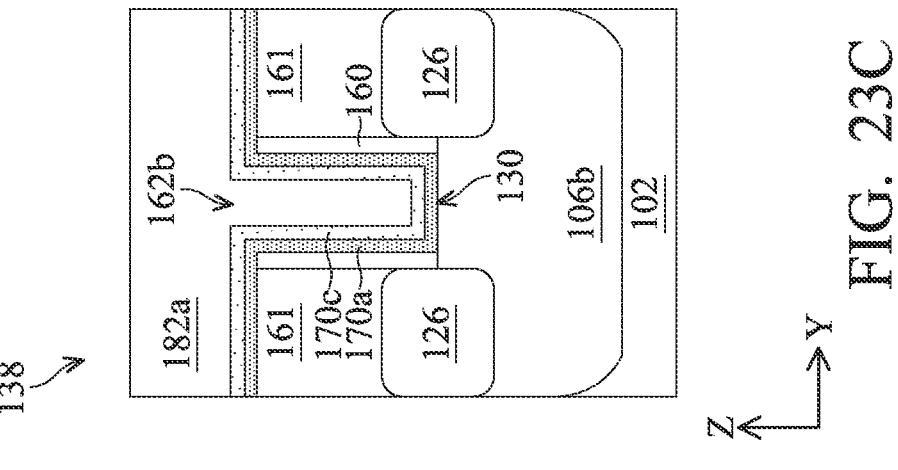
Figure 23B:
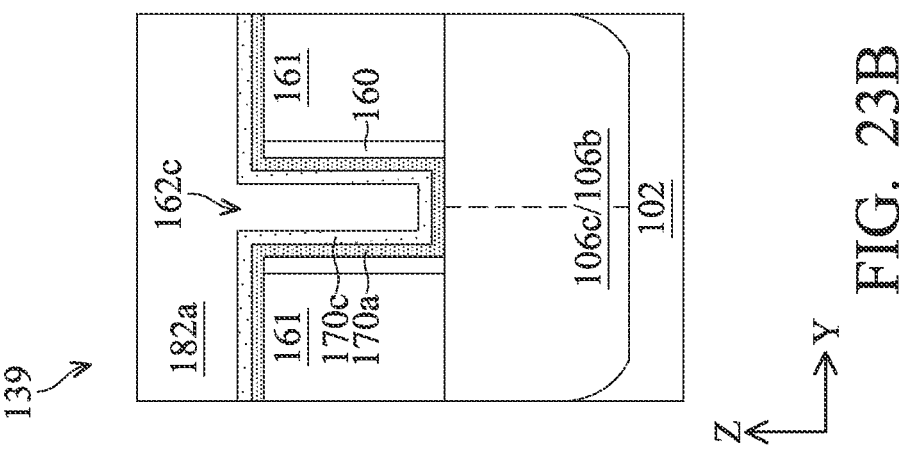
Figure 23A:
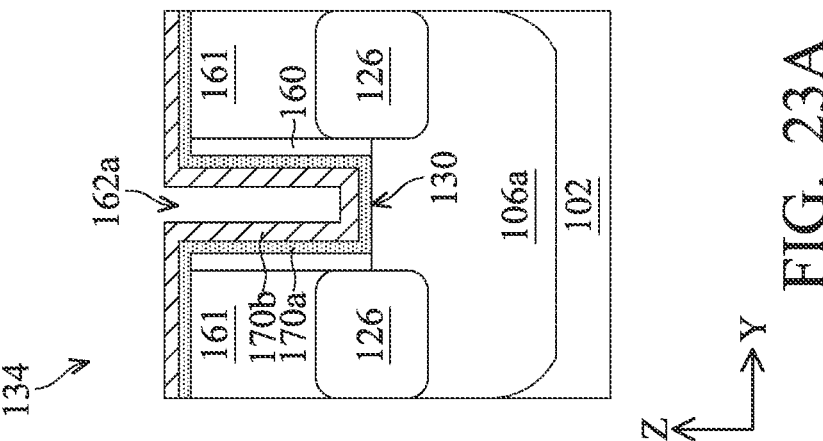
Figure 23F:
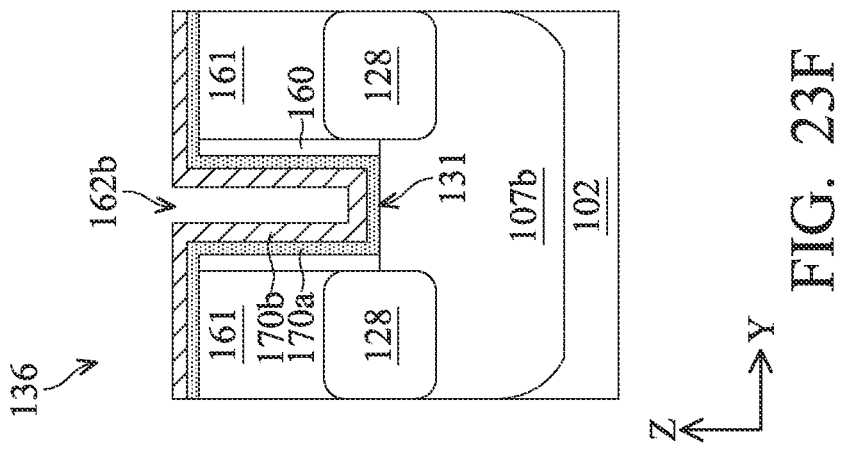
Figure 23E:
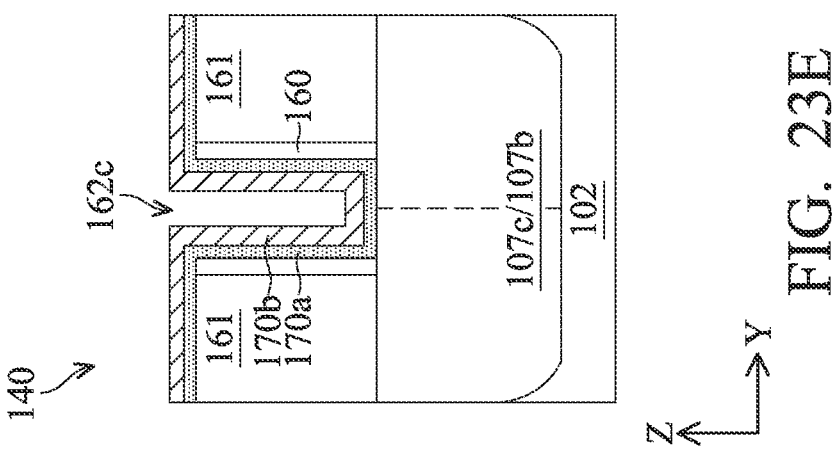
Figure 23D:
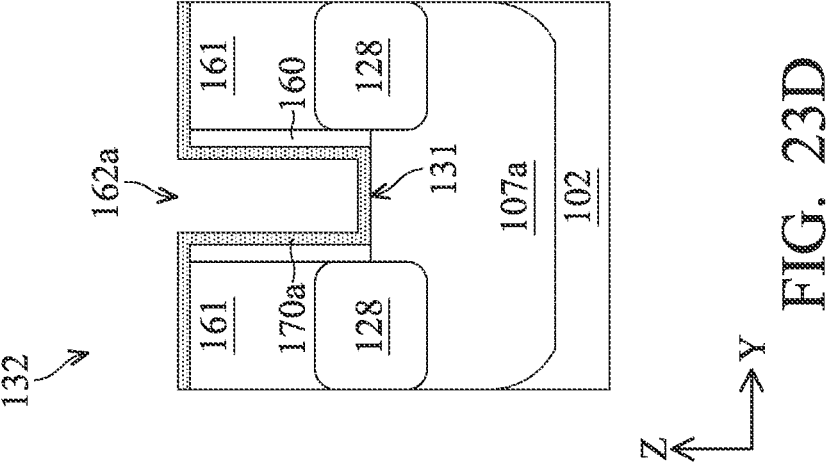
Figure 24:
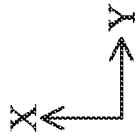
Figure 25C:
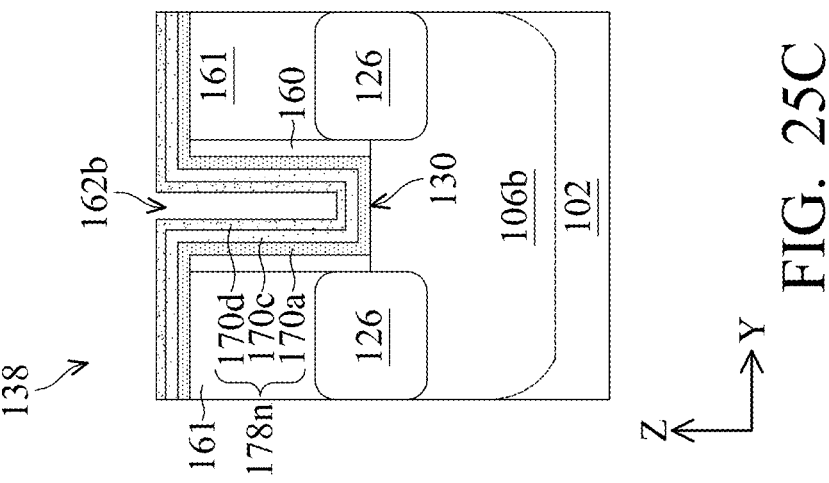
Figure 25B:
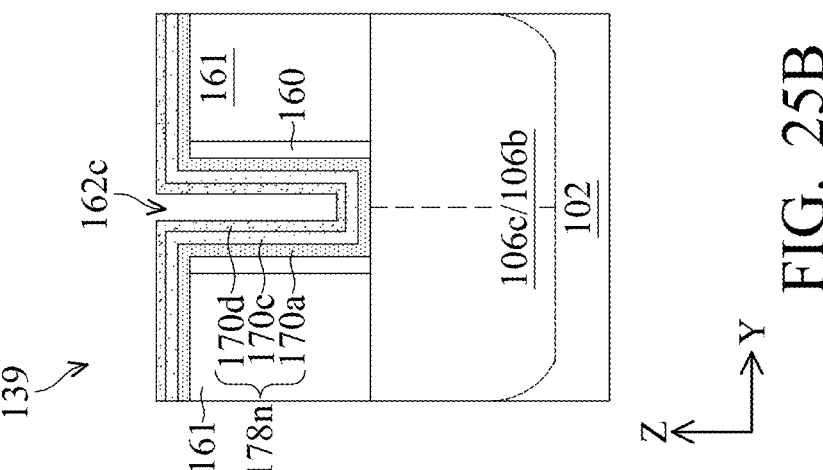
Figure 25A:
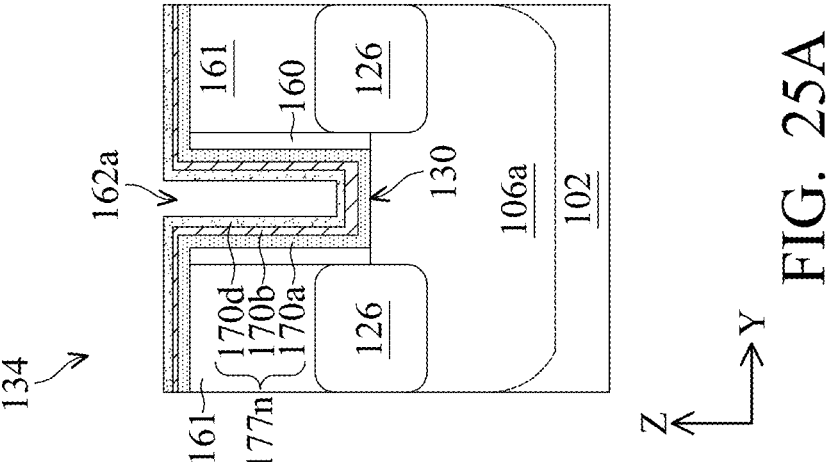
Figure 25F:
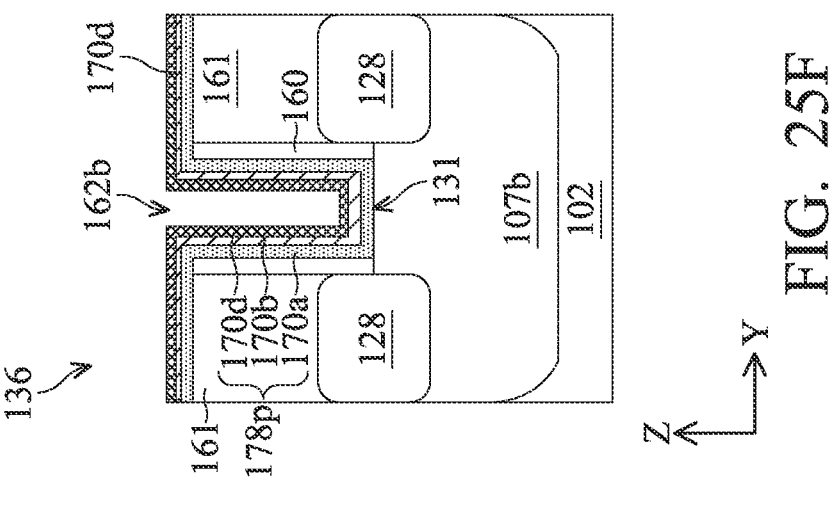
Figure 25E:
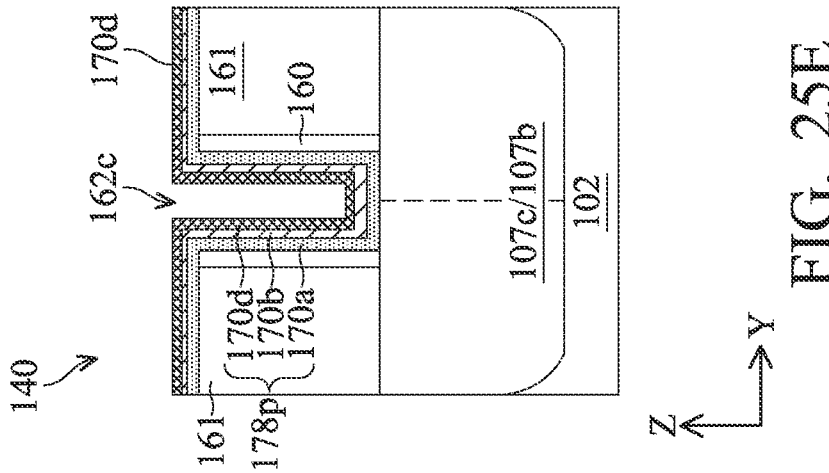
Figure 25D:
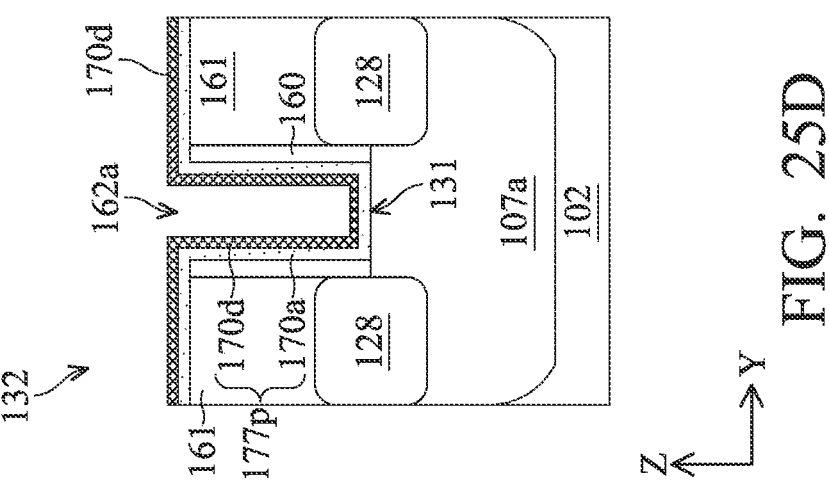
Figure 26:
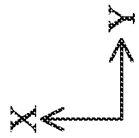
Figure 27C:
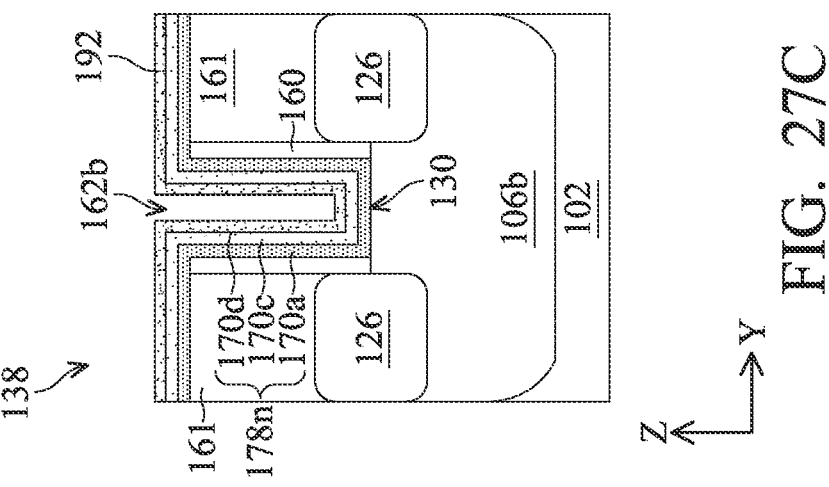
Figure 27B:
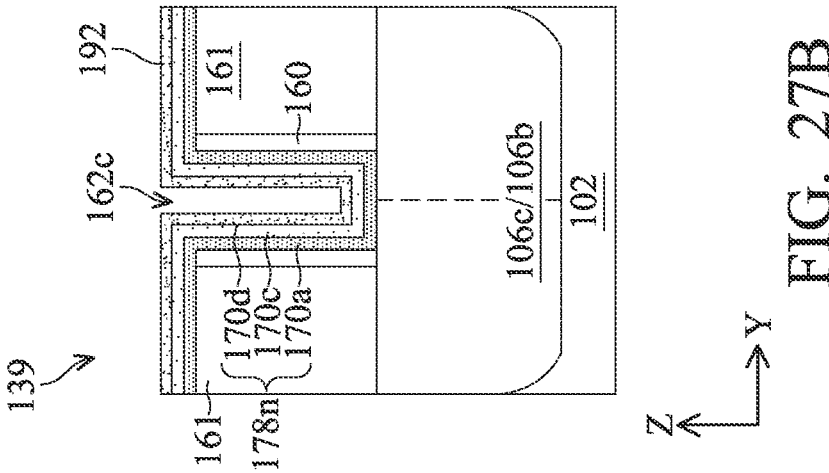
Figure 27A:
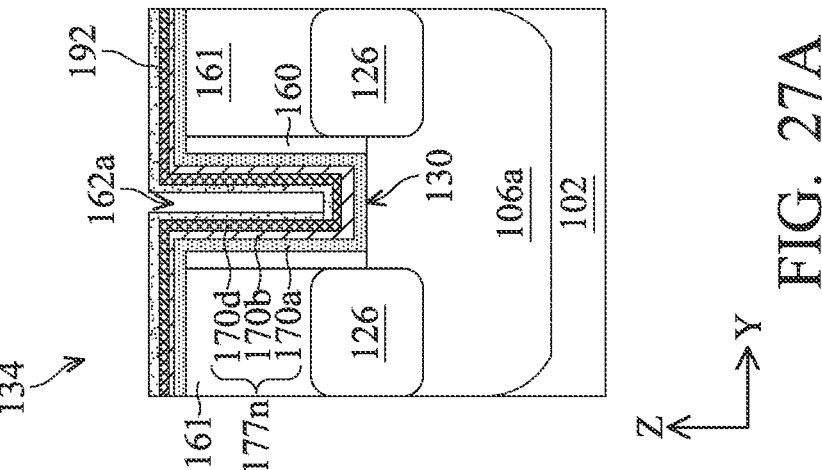
Figures 27D, 27E, 27F:
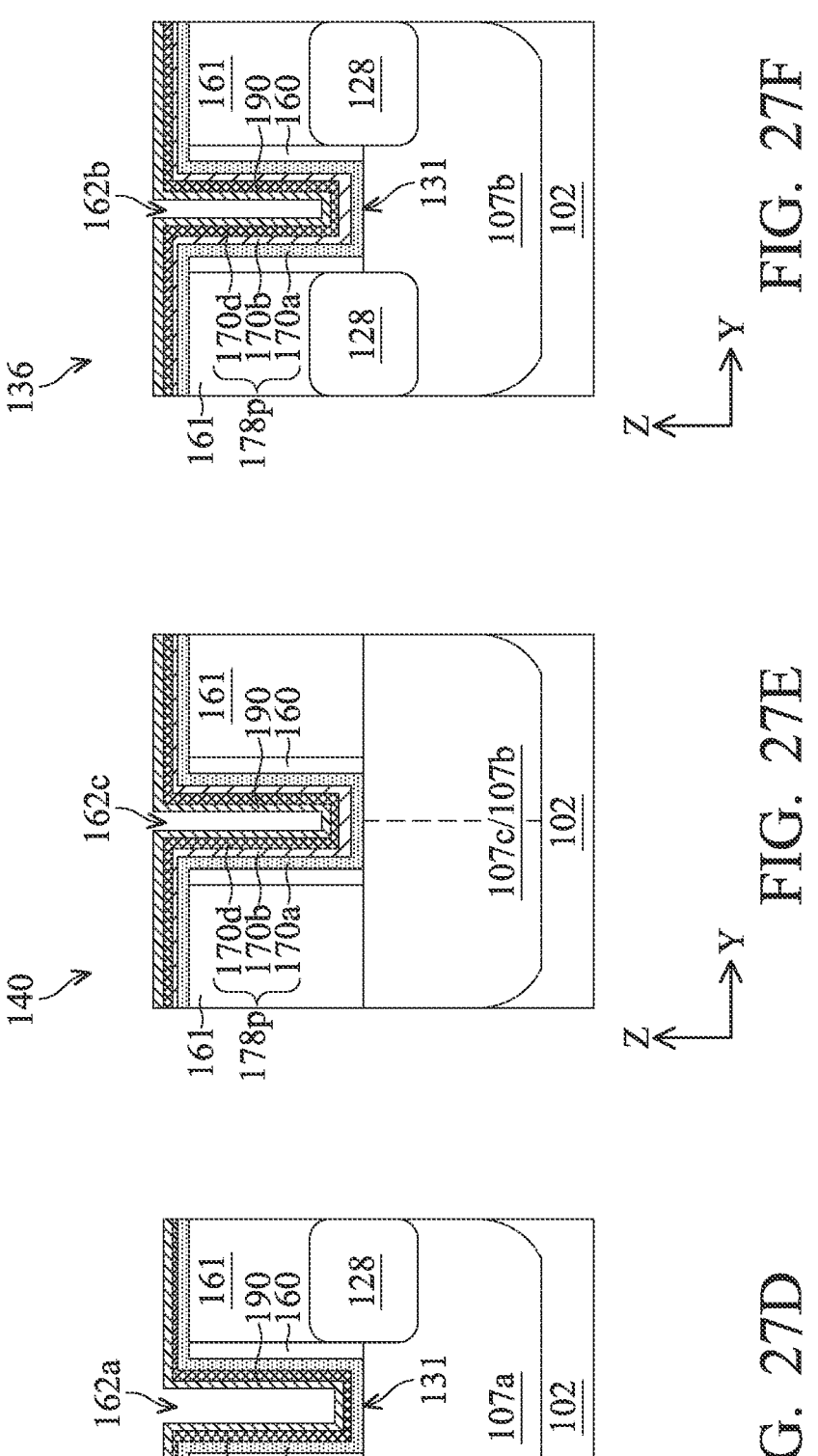
Figure 28:
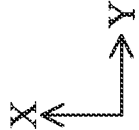
Figure 29C:
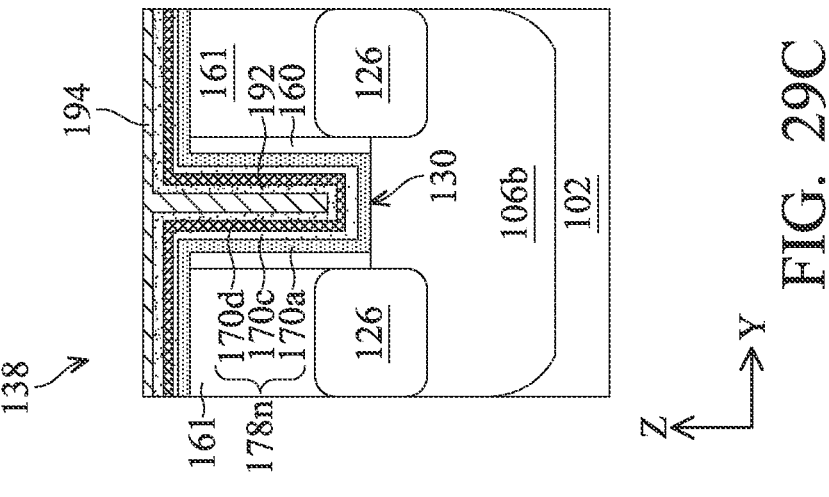
Figure 29B:
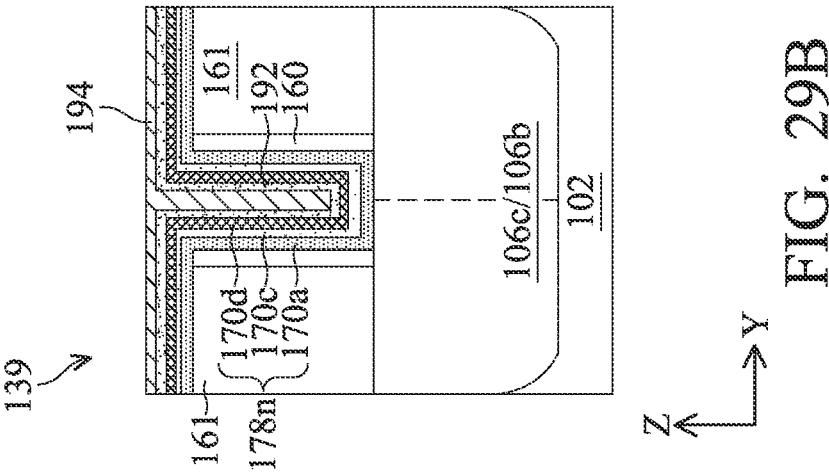
Figure 29A:
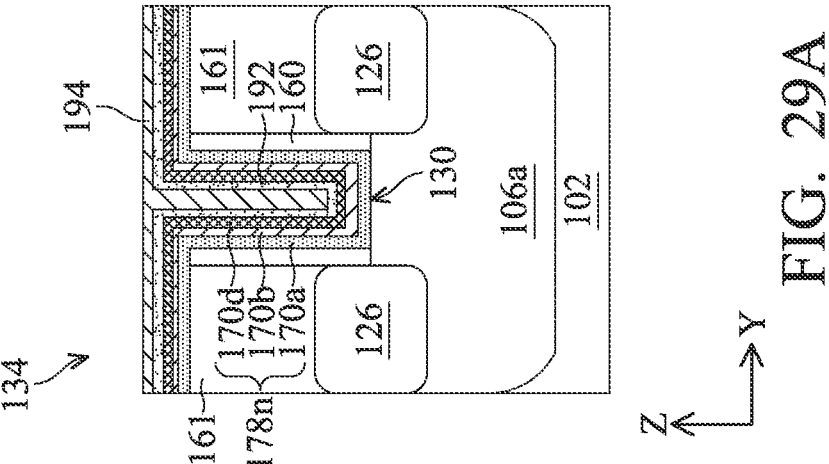
Figures 29D, 29E, 29F:
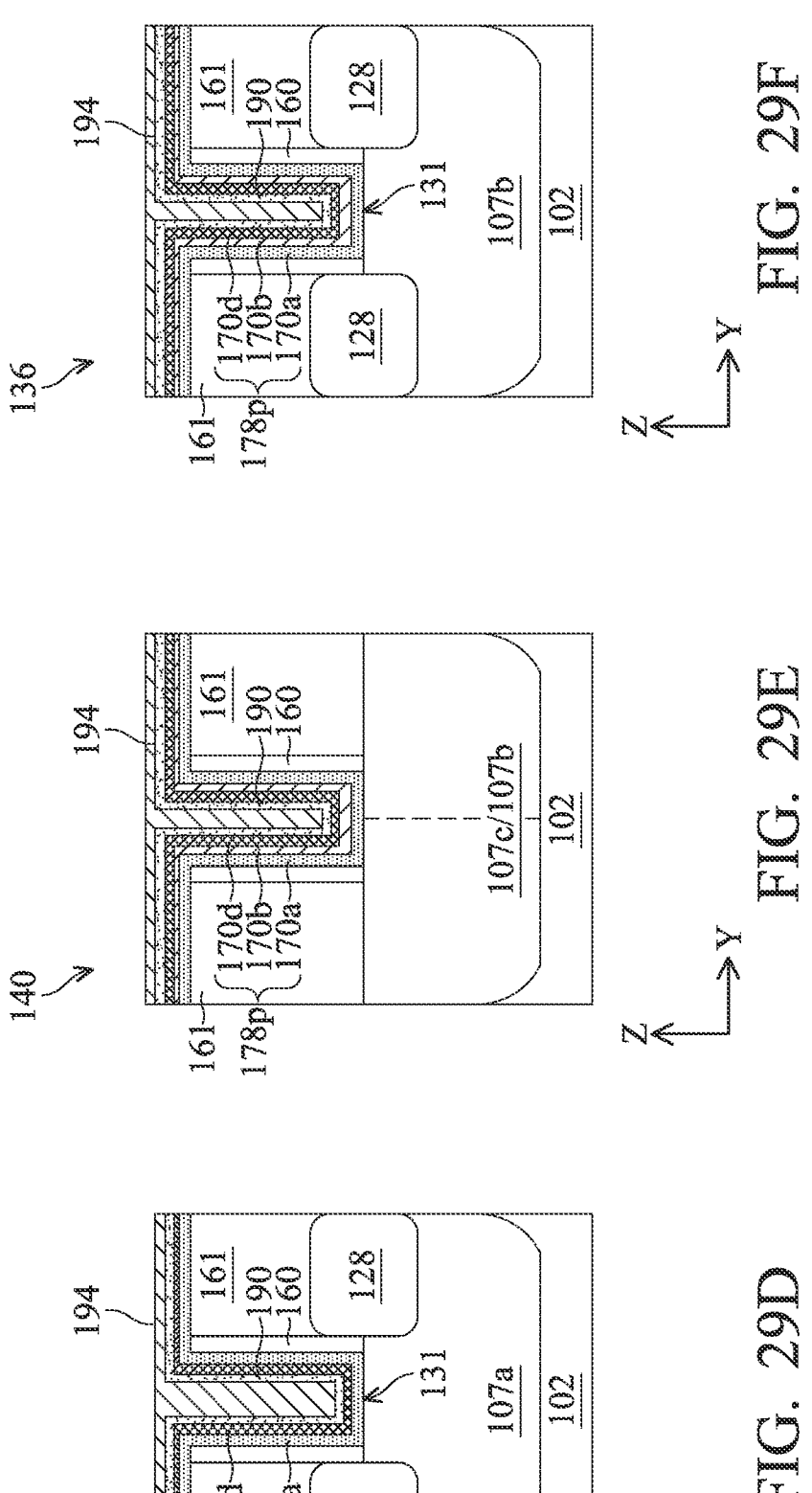
Figure 30:
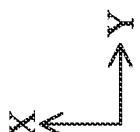

In the present embodiments, referring to FIG. 18B, which illustrates a portion of FIG. 18A in detail, the components 180*a* and 180*b* of the patterned masking element 180 are separated by and extend in opposite directions about the dielectric gate 114*a*, where the component 180*a* masks the device region of the NFET 134 and the component 180*b* masks the device region of the PFET 136 and the inactive region 140. In other words, vertical edges (along the X axis) of the components 180*a* and 180*b* are aligned with the dielectric gate 114*a*, such that the components 180*a* and 180*b* meet at a point (enclosed in the dotted circle) and do not overlap along the Y axis.

In contrast, FIG. 18C illustrates a semiconductor structure 100*e* that includes a patterned masking element 180' formed thereover. The patterned masking element 180' includes components 180*a*' and 180*b*' that have vertical edges defined by different dielectric gates (e.g., dielectric gates 114*a* and 114*d*) offset along the Y axis. As such, an overlapping region 180*e* between the components 180*a*' and 180*b*' is disposed in a filler cell 124', whose boundaries along the X axis are defined by the dielectric gates 114*a* and 114*d*, between the STD cells 120 and 122. The filler cell 124 of the semiconductor structure 100*a*, in contrast, have a first boundary defined by the dielectric gate 114*a* and a second boundary defined by the metal gate stack 112*c*. In the depicted embodiments, the overlapping region 180*e* has a lateral distance (along the Y axis) of 1*P.

In some embodiments, when STD cells are configured with relatively small sizes, e.g., having a cell width of less than or equal to 3*P, an overlapping distance of 1*P between portions of a patterned masking element significantly reduces a separation distance between the underlying gate trenches (e.g., the gate trenches 162) configured to form different device regions (e.g., device regions of the NFET 134 and the PFET 136). At reduced length-scales, excess PR in the overlapping region may lead to potential build-up and/or peeling of the PR material during the patterning process and, consequently, possible defects in the resulting material layers (e.g., gate dielectric layers, work function metal layers, etc.) formed in the gate trenches, which may inadvertently degrade device stability and performance. Accordingly, the present disclosure provides methods of designing patterned masking element having components in a point-touch configuration by aligning edges of the components along a single inactive gate (e.g., a dielectric gate) to reduce or prevent PR defects during metal gate formation. FIGS. 18D and 18E are similar to FIG. 18B and depict additional examples of the patterned masking element 180 applied over the semiconductor structures 100*b*, 110*c*, and 100*d*. In the present embodiments, the STD cells 120, 122, 150, and 152 are each defined by a cell width of 2*P as discussed above.

Referring to FIGS. 9, 20, and 21A-21F, method 300 at operation 310 forms a gate dielectric layer 170*c* over the patterned gate dielectric layer 170*b* in the gate trenches 162. In the present embodiments, the gate dielectric layer 170*c* is deposited conformally over the semiconductor structure 100*a*. The gate dielectric layer 170*c* may include any suitable dielectric material provided herein (see discussion above for the gate dielectric layer 170*a*). However, in the present embodiments, the gate dielectric layer 170*c* has a composition different from that of the gate dielectric layers 170*a* and 170*b*. The gate dielectric layer 170*c* may be formed by any suitable method provided herein.

Referring to FIGS. 9, 22, and 23A-23F, method 300 at operation 312 patterns the gate dielectric layer 170*c*, such that it remains over certain portions of the semiconductor structure 100*a*. In the depicted embodiments, the patterned gate dielectric layer 170*c* remains over the device region of the NFET 138 and the inactive region 139 but is removed from the device region of the NFET 134, the device region of the PFET 132, the inactive region 140, and the device region of the PFET 136. In the present embodiments, a patterned masking element 182 that includes components 182*a* and 182*b* is formed over the gate dielectric layer 170*c*, where the patterned masking element 182 is configured to mask device regions (and the inactive region) over which the gate dielectric layer 170*c* is to remain. The patterned masking element 182 may be similar to the patterned masking element in structure and methods of formation as discussed in detail above with respect to operation 210. For example, the patterned masking element 182 may include at least a PR layer patternable by a series of photolithography processes.

Subsequently, referring to FIGS. 23A-23F, method 300 at operation 312 removes the portions of the gate dielectric layer 170*c* by a suitable etching process (e.g., a dry etching process, a wet etching process, an RIE process, or combinations thereof) using the patterned masking element 182 as an etch mask. Following the etching process, the patterned masking element 182 may then be removed from the semiconductor structure 100*a* by any suitable method, such as plasma ashing and/or resist stripping.

Referring to FIGS. 9, 24, and 25A-25F, method 300 at operation 314 forms a gate dielectric layer 170*d* over the patterned gate dielectric layer 170*c* in the gate trenches 162. In the present embodiments, the gate dielectric layer 170*d* is deposited conformally over the semiconductor structure 100*a* and may include any suitable dielectric material provided herein (see discussion above for the gate dielectric layer 170*a*). However, in the present embodiments, the gate dielectric layer 170*d* has a composition different from that of the gate dielectric layers 170*a*, 170*b*, and 170*c*. The gate dielectric layer 170*d* may be formed by any suitable method provided herein.

In the present embodiments, method 300 at operations 304-314 forms various combinations of the gate dielectric layers 170*a*-170*d* in the gate trenches 162*a*-162*c*, resulting in a gate dielectric stack 177*n* in the device region of NFET 134, a gate dielectric stack 178*n* in the inactive region 139 and the device region of NFET 138, a gate dielectric stack 177*p* in the device region of PFET 132, and a gate dielectric stack 178*p* in the inactive region 140 and the device region of PFET 136. In some embodiments, composition of each of the gate dielectric stacks 177*n*, 177*p*, 178*n*, and 178*p* is configured to provide a target V t for their respective FETs. In this regard, the configuration of each of the gate dielectric stacks 177*n*, 177*p*, 178*n*, and 178*p* depicted herein is for illustration purposes only and does not limit the present embodiments as so. For example, gate dielectric layers may be removed from or added to one or more of the gate dielectric stacks 177*n*, 177*p*, 178*n*, and 178*p* according to some embodiments.

Thereafter, referring to FIGS. 9, 26, and 27A-27F, method 300 at operations 316 and 318 may form WFM layers over the substrate 102 to further tune the targe V t of each FET provided herein. In the depicted embodiments, a WFM layer 190 may be formed over the PFETs 132 and 136 (and over the inactive region 140), and a WFM layer 192 may be formed over the NFETs 134 and 138 (and over the inactive region 139). The WFM layers 190 and 192 may each include a p-type WFM, an n-type WFM, or a combination thereof. Examples of WFMs include TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function metals, or combinations thereof. In some embodiments, the WFM layers 190 and 192 each include one or more WFMs, the combination of which is configured in accordance with specific design requirements (e.g., the target V t). The WFM layers 190 and 192 may be selectively formed over their corresponding gate dielectric stacks 177*n*, 177*p*, 178*n*, and 178*p* in a series of deposition, patterning, and etching processes similar to those discussed above with respect to the formation of the patterned gate dielectric layer 170*b* (i.e., operations 306 and 308), though the specific patterned masking elements employed may differ.

Referring to FIGS. 9, 28, and 29A-29F, method 300 at operation 320 deposits a metal fill layer (alternatively referred to as a bulk conductive layer) 194 over the WFM layers 190 and 192, thereby filling the gate trenches 162. The metal fill layer 194 may include Co, W, Ru, Cu, Al, Ti, Ni, Au, Pt, Pd, other suitable materials, or combinations thereof. The metal fill layer 194 may be deposited using any suitable method, such as ALD, CVD, PVD, plating, other suitable methods, or combinations thereof.

Figures 31A, 31B, 31C:
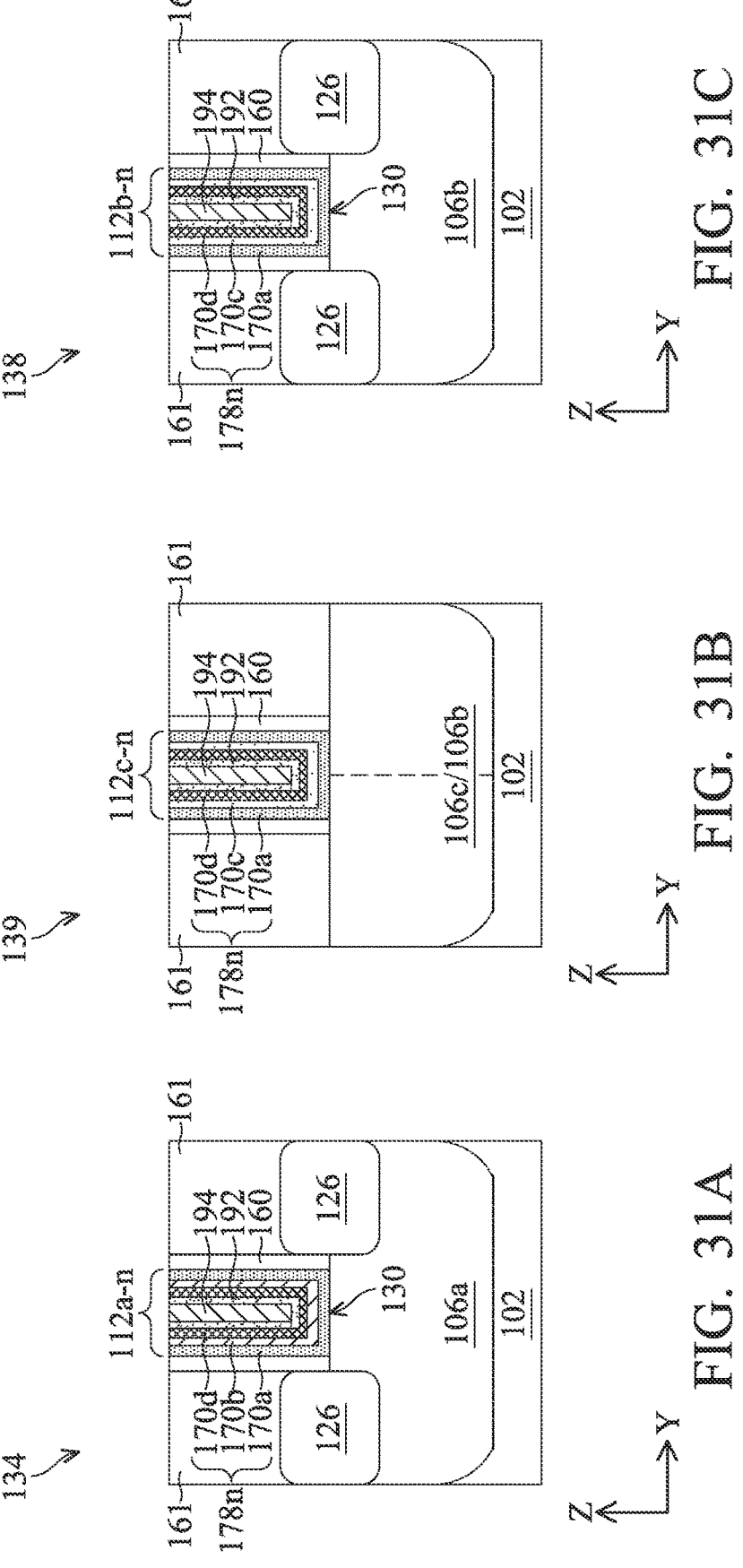
Figures 31D, 31E, 31F:

Subsequently, referring to FIGS. 9, 30 and 31A-31F, method 300 at operation 322 performs one or more CMP processes to planarize the various layers formed in the gate trenches 162, resulting in the metal gate stacks 112*a*, 112*b*, and 112*c* to engage with the fin structures 106 and 107 and form FETs in the STD cells 120 and 122. In the present embodiments, the metal gate stacks 112*a*-112*c* depicted in FIGS. 31A-31C are each designated with "-n" to denote the formation of NFETs, and the metal gate stacks 112*a*-112*c* depicted in FIGS. 31D-31F are each designated with "-p" to denote the formation of PFETs. In accordance with the depicted embodiments of the semiconductor structure 100*a*, the metal gate stack 112*c* is configured to have substantially the same structure as the nearest metal gate stack 112*b*.

Different embodiments may provide different benefits, and not all benefits are required for any specific embodiment. In some embodiments, the present disclosure provides an IC layout that includes two STD cells and an inactive, filler cell disposed therebetween. Each STD cell may include two or more FETs integrated into a circuit block. In some embodiments, the two STD cells differ in layout. In some embodiments, the IC layout includes fin active regions continuously extending through the STD cells and the filler cell, where the fin active regions vary in width between the STD cells. In some embodiments, the filler cell adjoins one of the STD cells on a dielectric gate and adjoins the other one of the STD cells on a dummy metal gate stack, which is configured with the same structure as a nearest functional metal gate stack. In some embodiments, depending on the difference in fin width across the STD cells, one or more filler cells may be incorporated in the IC layout to accommodate such difference during fabrication. In some embodiments, the present disclosure further provides a method of forming metal gate stacks in IC layout including STD cells. In some examples, the STD cells may be relatively small with less than or equal to three gate pitches in cell width. In some embodiments, a patterned masking element is configured with edge-to-edge alignment between components covering different device regions for purposes of reducing PR scum and/or peeling during the patterning process, thereby mitigating potential defects of the resulting functional metal gate stacks at reduced length scales.

In one aspect, the present disclosure provides an integrated circuit structure that includes a semiconductor substrate and a fin structure protruding from the semiconductor substrate, the fin structure including a first portion having a first width, a second portion having a second width that is different from the first width, and third portion extending continuously along a first direction over the semiconductor substrate, the first width and the second width being measured along a second direction perpendicular to the first direction. The integrated circuit structure also includes a first standard cell including a first metal gate stack engaged with the first portion, a second standard cell including a second metal gate stack engaged with the second portion, and a filler cell disposed between the first standard cell and the second standard cell, where the filler cell includes the third portion that connects the first portion to the second portion. The integrated circuit structure further includes a dielectric gate defining a first boundary of the filler cell and a third metal gate stack defining a second boundary of the filler cell, where the dielectric gate and the third metal gate stack are separated by a one-pitch spacing P.

In another aspect, the present disclosure provides an integrated circuit structure that includes a fin structure including a first portion having a first width, a second portion having a second width, and a third portion having a third width, the fin structure protruding from a semiconductor substrate, where the third portion extends from the first portion to the second portion, and where the second width differs from the first width. The integrated circuit structure also includes a first transistor in a first standard cell, where the first transistor includes a first metal gate stack engaged with the first portion. The integrated circuit structure also includes a second transistor in a second standard cell, where the second transistor includes a second metal gate stack engaged with the second portion. The integrated circuit structure also includes a dielectric gate disposed between the first metal gate stack and the second metal gate stack and a third metal gate stack disposed between the dielectric gate and the second metal gate stack, where the third metal gate stack is inactive. The integrated circuit structure further includes a filler cell sandwiched between the first standard cell and the second standard cell, where boundaries of the filler cell are defined by the dielectric gate and the third metal gate stack, and where the third portion extends across a width of the filler cell.

In yet another aspect, the present disclosure provides a method of forming an integrated circuit structure that includes forming a fin structure including a first portion, a second portion, and a third portion over a substrate, where the third portion extends continuously in a first direction between the first portion and the second portion, and where the second portion and the third portion differ in a width measured along the second direction perpendicular to the first direction; forming a first dummy gate structure, a second dummy gate structure, a third dummy gate structure, and a fourth dummy gate structure each oriented lengthwise in the second direction, where the first dummy gate structure and the second dummy gate structure engage with the first portion and the second portion, respectively, and where the third dummy gate structure and the fourth dummy gate structure are disposed between the first dummy gate structure and the second dummy gate structure; replacing the third dummy gate structure with a dielectric gate; removing the first dummy gate structure, the second dummy gate structure, and the fourth dummy gate structure to form a first trench, a second trench, and a third trench, respectively; and forming a first metal gate stack, a second metal gate stack, and a third metal gate stack in the first trench, the second trench, and the third trench, respectively, where: the first metal gate stack engages with the first portion to form a first transistor in a first standard (STD) cell, the second metal gate stack engages with the second portion to form a second transistor in a second std cell, the third metal gate stack defines a first boundary of a filler cell sandwiched between the first std cell and the second std cell, the dielectric gate defines a second boundary of the filler cell, and the third portion spans a width of the filler cell.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit structure, comprising:
a semiconductor substrate;
a fin structure protruding from the semiconductor substrate, including a first portion having a first width, a second portion having a second width that is different from the first width, and a third portion extending continuously along a first direction over the semiconductor substrate, the first width and the second width being measured along a second direction perpendicular to the first direction;
a first standard cell including a first metal gate stack engaged with the first portion;
a second standard cell including a second metal gate stack engaged with the second portion;
a filler cell disposed between the first standard cell and the second standard cell, wherein the filler cell includes the third portion that connects the first portion to the second portion;
a dielectric gate different in composition from the first and second metal gate stacks and defining a first boundary of the filler cell; and
a third metal gate stack defining a second boundary of the filler cell, wherein the dielectric gate and the third metal gate stack are separated by a one-pitch spacing P.

2. The integrated circuit structure of claim 1, wherein the dielectric gate defines a boundary of the first standard cell and the third metal gate stack defines a boundary of the second standard cell.

3. The integrated circuit structure of claim 1, wherein the first metal gate stack and the second metal gate stack are configured as functional metal gate stacks and the third metal gate stack is configured as a dummy metal gate stack.

4. The integrated circuit structure of claim 1, wherein the third portion has a sidewall horizontally aligned with a sidewall of the first portion or the third second portion, and the
sidewall of the third portion spans a distance between the dielectric gate and the third metal gate stack.

5. The integrated circuit structure of claim 1, wherein the filler cell abuts the first standard cell and the second standard cell.

6. The integrated circuit structure of claim 1, wherein first standard cell and the second standard cell each span a lateral distance of no more than 3*P.

7. An integrated circuit structure, comprising:
a fin structure including a first portion having a first width, a second portion having a second width, and a third portion having a third width, the fin structure protruding from a semiconductor substrate and extending lengthwise along a first direction, wherein the third portion extends from the first portion to the second portion, wherein the second width differs from the first width, and wherein sidewalls of the second and the third portions form an L-shaped step profile defined by an exposed surface of the second portion extending from a sidewall of the second portion to a sidewall of the third portion along a second direction different from the first direction;
a first transistor in a first standard cell, wherein the first transistor includes a first metal gate stack engaged with the first portion;
a second transistor in a second standard cell, wherein the second transistor includes a second metal gate stack engaged with the second portion;
a dielectric gate different in composition from the first and second metal gate stacks and disposed between the first metal gate stack and the second metal gate stack;
a third metal gate stack disposed between the dielectric gate and the second metal gate stack, wherein the third metal gate stack is inactive; and
a filler cell sandwiched between the first standard cell and the second standard cell, wherein boundaries of the filler cell are defined by the dielectric gate and the third metal gate stack, and wherein the third portion extends across a width of the filler cell.

8. The integrated circuit structure of claim 7, wherein the filler cell is free of any transistor.

9. The integrated circuit structure of claim 7, wherein the first standard cell and the second standard cell include the same number of transistors.

10. The integrated circuit structure of claim 7, wherein the second width is less than the first width.

11. The integrated circuit structure of claim 7, wherein the second width is greater than the third width.

12. The integrated circuit structure of claim 7, wherein the first standard cell further includes a third transistor, wherein the third transistor includes the first metal gate stack engaged with a fourth portion of the fin structure, the fourth portion having a fourth width that is greater than the first width.

13. The integrated circuit structure of claim 12, wherein the first transistor is of n-type and the third transistor is of p-type.

14. The integrated circuit structure of claim 12, wherein a width of the filler cell is one gate pitch P.

15. The integrated circuit structure of claim 12, wherein the second metal gate stack and the third metal gate stack are separated by one gate pitch P.

16. The integrated circuit structure of claim 12, wherein the third metal gate stack is configured with the same structure as the first metal gate stack or the second metal gate stack.

17. The integrated circuit structure of claim 12, wherein the filler cell is a first filler cell, the integrated circuit further comprising:
a fourth metal gate stack disposed between the first metal gate stack and the dielectric gate; and
a second filler cell with boundaries defined by the fourth metal gate stack and the dielectric gate.

18. The integrated circuit structure of claim 17, wherein the fourth metal gate stack and the dielectric gate are separated by one gate pitch P.

19. An integrated circuit structure, comprising:
a fin structure including a first portion, a second portion, and a third portion over a substrate, wherein the third portion extends continuously in a first direction between the first portion and the second portion, and wherein the second portion and the third portion differ in a width measured along a second direction perpendicular to the first direction, wherein the first, the second, and the third portions of the fin structure are horizontally aligned on a first side of the fin structure along the first direction and horizontally misaligned on a second side of the fin structure along the first direction; and a first gate structure, a second gate structure, a third gate structure, and a fourth gate structure each oriented lengthwise in the second direction, wherein the first gate structure and the second gate structure engage with the first portion and the second portion, respectively, and wherein the third gate structure and the fourth gate structure are disposed between the first gate structure and the second gate structure, wherein the third gate structure is a dielectric gate different in composition from the first and second gate structures, wherein the first gate structure, the second gate structure, and the fourth gate structure are metal gates, thereby forming first, second, and third metal gates, respectively, wherein:

the first metal gate engages with the first portion to form a first transistor in a first standard (STD) cell, the second metal gate engages with the second portion to form a first transistor in a second STD cell, the third metal gate defines a first boundary of a filler cell sandwiched between the first STD cell and the second STD cell, the dielectric gate defines a second boundary of the filler cell, and the third portion spans a width of the filler cell.

20. The integrated circuit structure of claim 19, wherein the first portion, the second portion, and the third portion are formed in a first doped region of the substrate, the fin structure further comprising a fourth portion, a fifth portion, and a sixth portion disposed in a second doped region adjacent the first doped region along the second direction, the first doped region and the second doped region having dopants of different conductivity types, wherein:

the first metal gate and the second metal gate is engaged with the fourth portion and the fifth portion to form a second transistor in the first STD cell and a second transistor in the second STD cell, respectively.

* * * * *